(12) United States Patent
Stehle et al.

(10) Patent No.: US 10,501,314 B2
(45) Date of Patent: Dec. 10, 2019

(54) SYSTEM AND METHOD FOR MAINTAINING A SMOOTHED AND ANTI-STICTION SURFACE ON A MEMS DEVICE

(71) Applicant: Robert Bosch GmbH, Stuttgart (DE)

(72) Inventors: Jochen Stehle, Palo Alto, CA (US); Gary Yama, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 1 day.

(21) Appl. No.: 16/066,607

(22) PCT Filed: Dec. 29, 2016

(86) PCT No.: PCT/EP2016/082813
§ 371 (c)(1),
(2) Date: Jun. 27, 2018

(87) PCT Pub. No.: WO2017/114886
PCT Pub. Date: Jul. 6, 2017

(65) Prior Publication Data
US 2019/0016592 A1   Jan. 17, 2019

Related U.S. Application Data

(60) Provisional application No. 62/273,133, filed on Dec. 30, 2015.

(51) Int. Cl.
*B81C 1/00* (2006.01)
*B81B 3/00* (2006.01)

(52) U.S. Cl.
CPC ........ *B81C 1/00333* (2013.01); *B81B 3/0016* (2013.01); *B81C 2203/0118* (2013.01); *B81C 2203/0136* (2013.01); *B81C 2203/0145* (2013.01); *B81C 2203/0154* (2013.01)

(58) Field of Classification Search
CPC ................................................ B81C 1/00333
See application file for complete search history.

(56) References Cited

U.S. PATENT DOCUMENTS

2011/0298065 A1   12/2011  Partridge et al.

OTHER PUBLICATIONS

International Search Report corresponding to PCT Application No. PCT/EP2016/082813, dated Mar. 9, 2017 (3 pages).

*Primary Examiner* — Errol V Fernandes
(74) *Attorney, Agent, or Firm* — Maginot, Moore & Beck LLP

(57) ABSTRACT

A method of fabricating a MEMS device includes an epi-polysilicon cap layer epitaxially growth on one of a substrate or a sacrificial layer deposited on the substrate. A portion of the epi-polysilicon cap layer has been removed to form a plurality of access openings. The sacrificial layer is etched away to form a cavity below the access openings. A barrier layer is deposited over the epi-polysilicon cap layer, inner walls of the cavity, and inner walls of the access openings using an atomic layer deposition (ALD) process. A refill epi-polysilicon layer is epitaxially grown in the access openings and seals the openings after the cavity is formed.

15 Claims, 32 Drawing Sheets

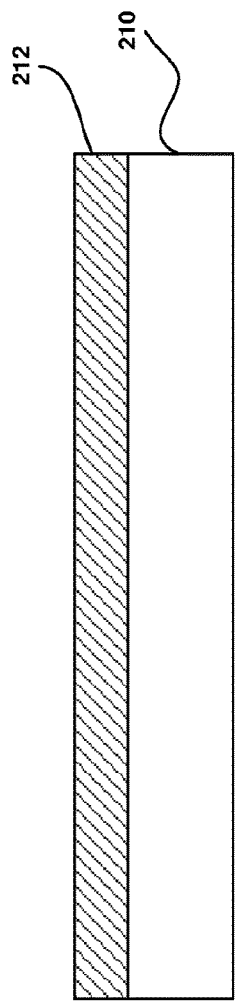
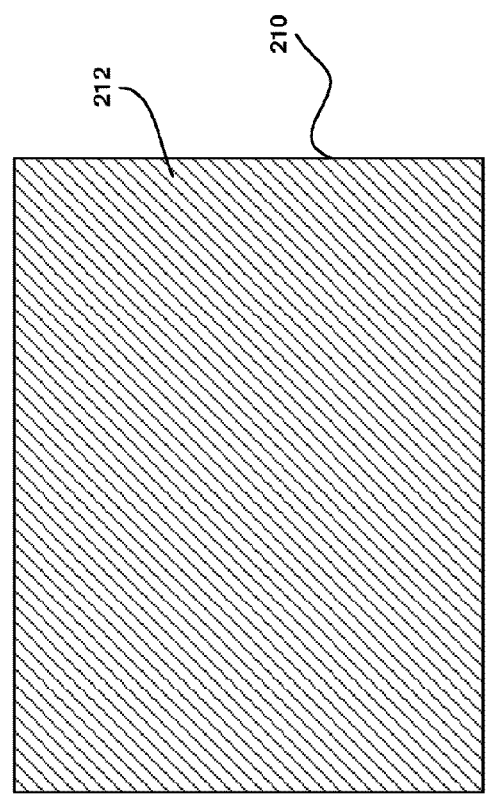

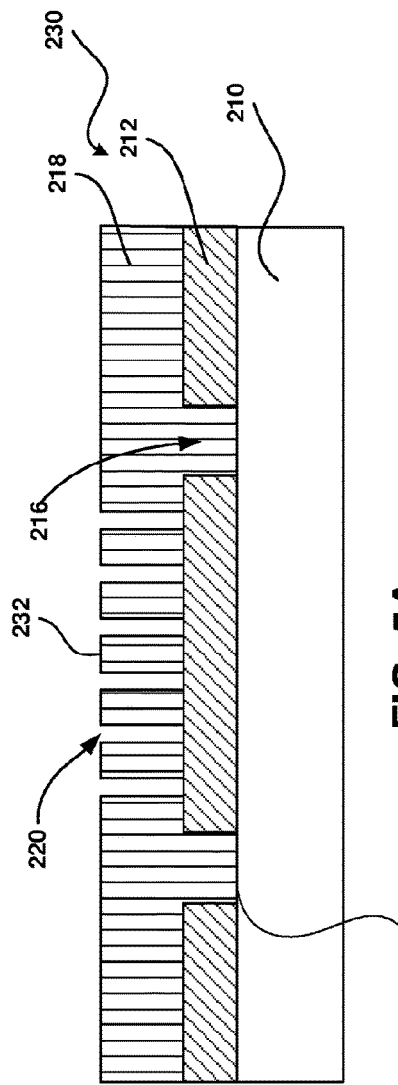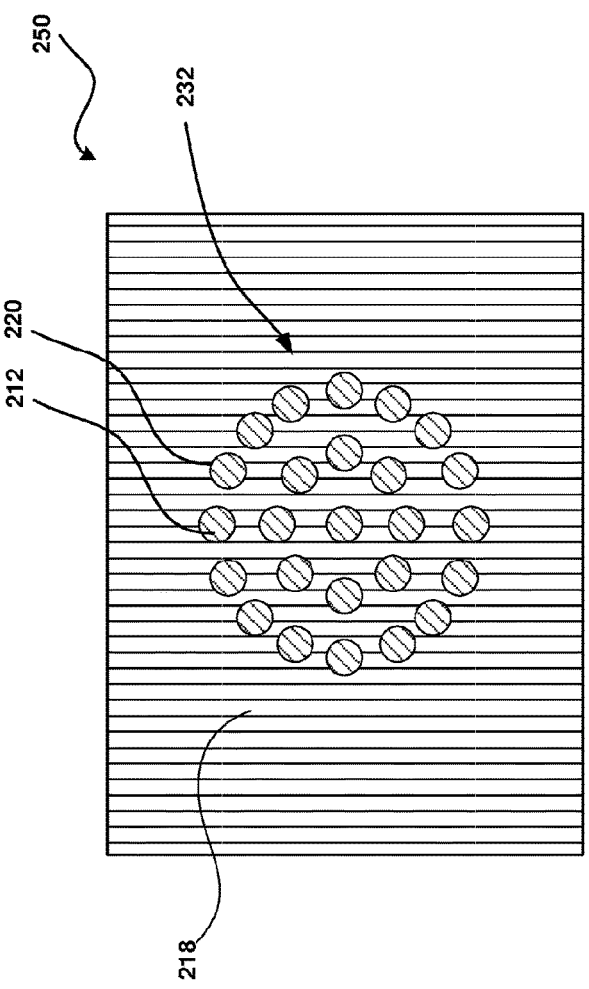

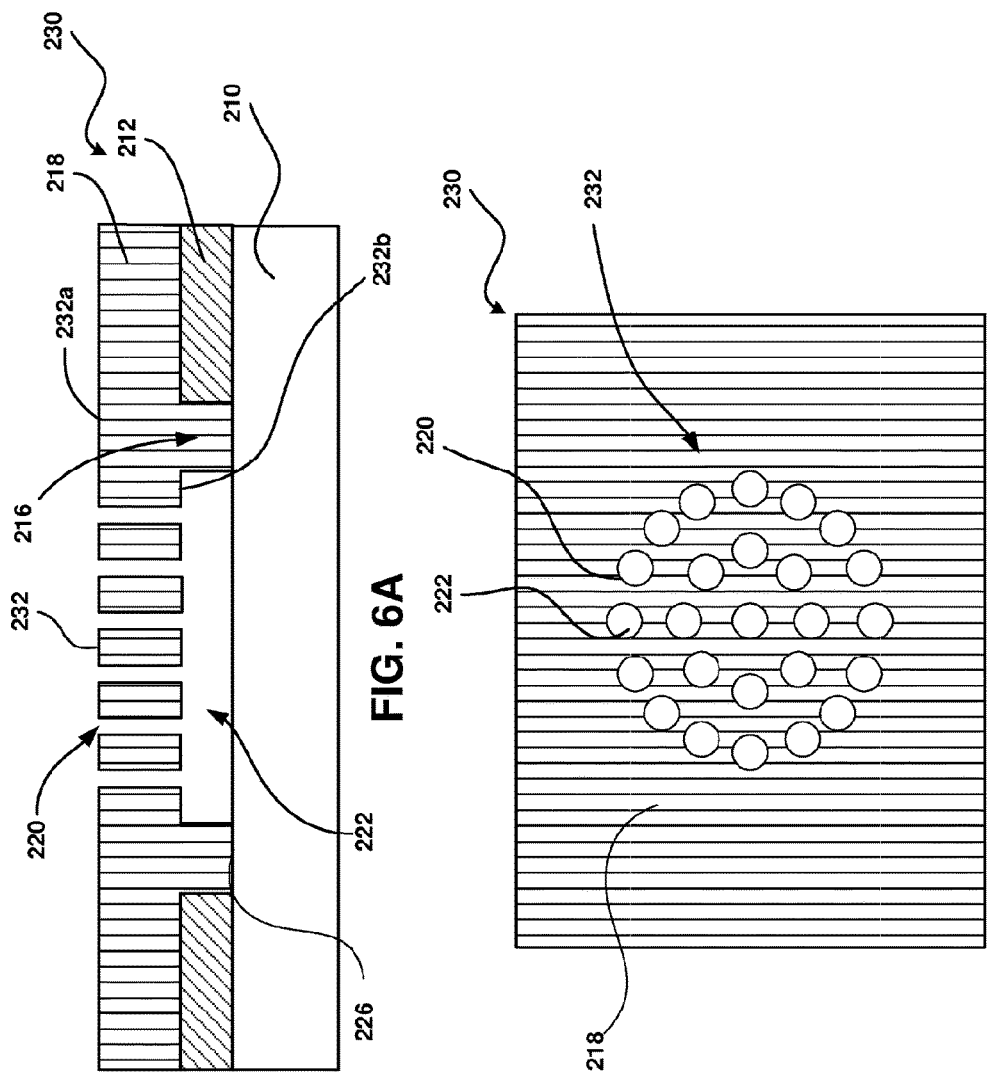

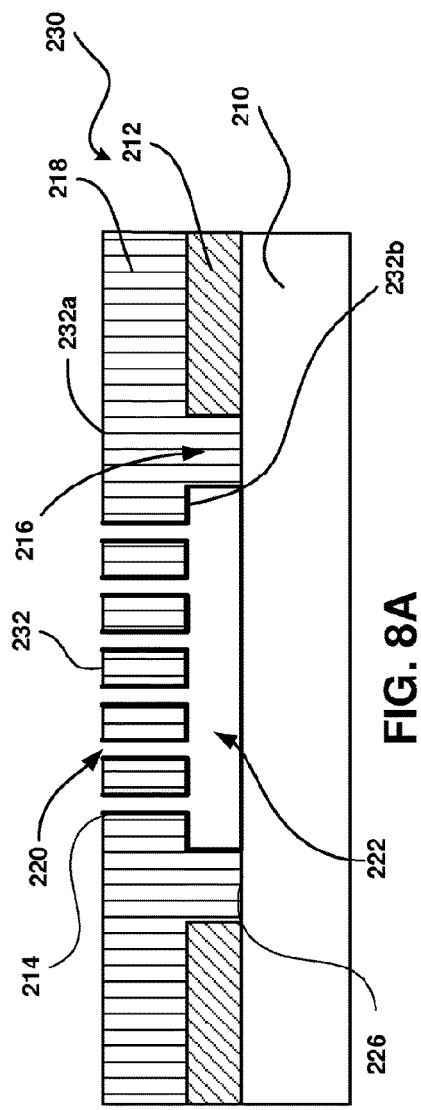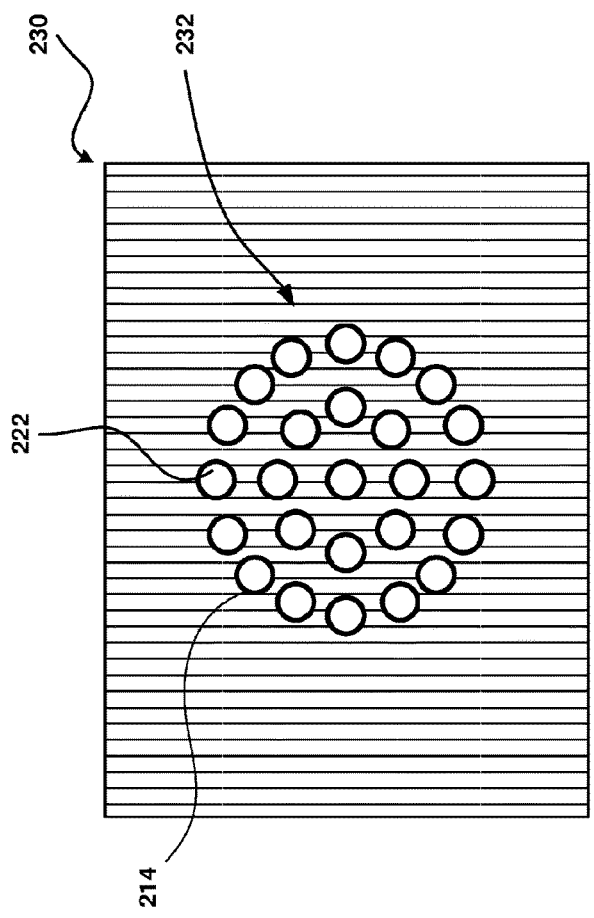
FIG. 8A
FIG. 8B

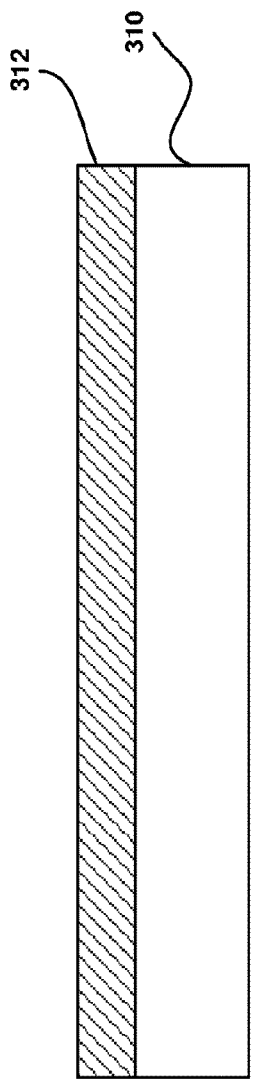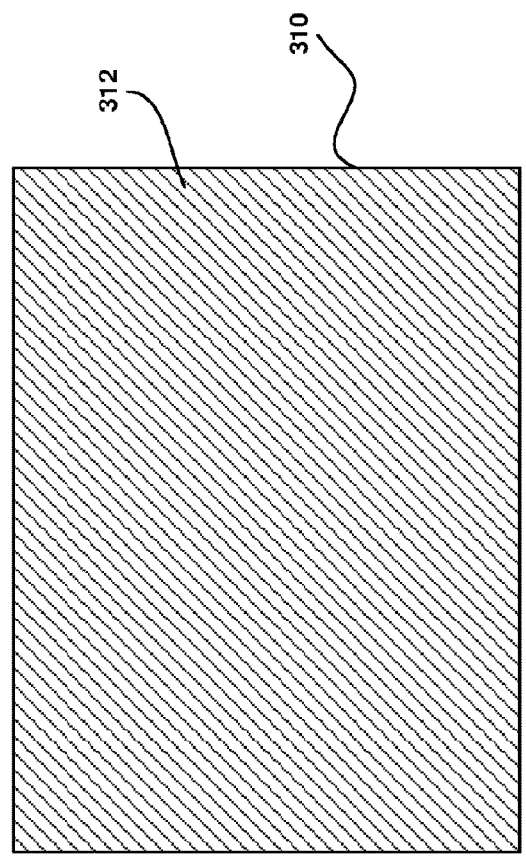
FIG. 11A
FIG. 11B

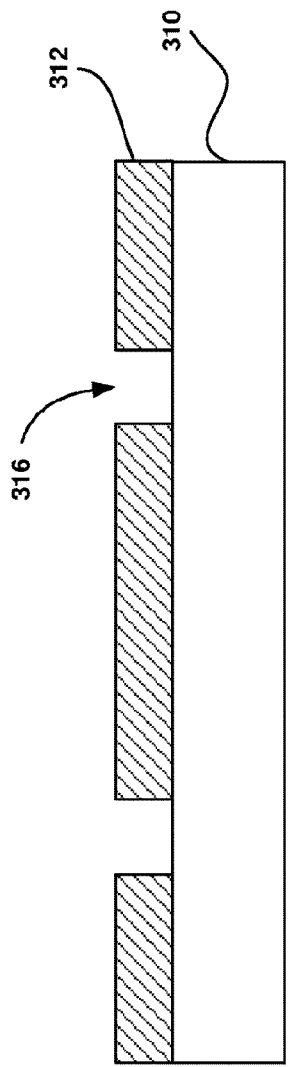
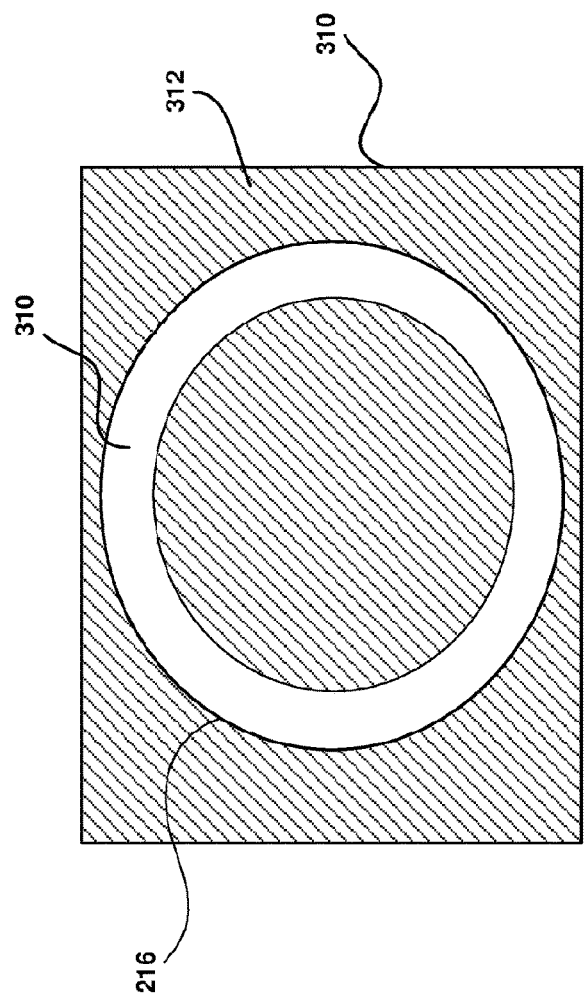

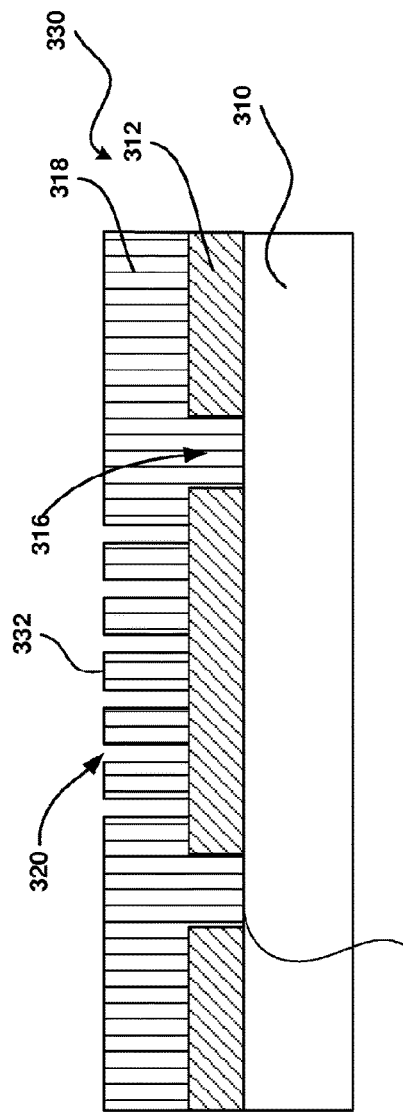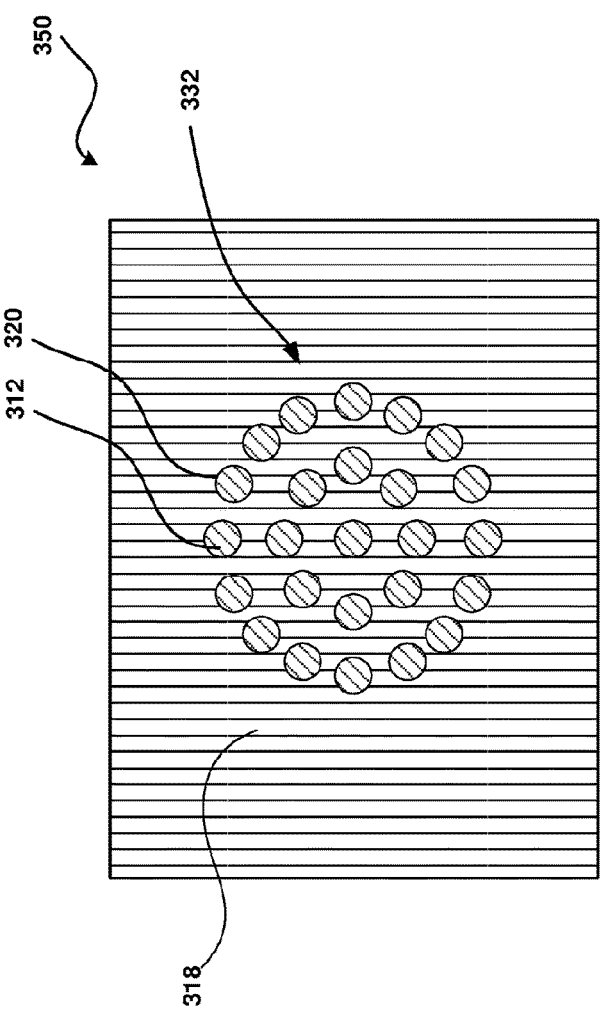
FIG. 14A
FIG. 14B

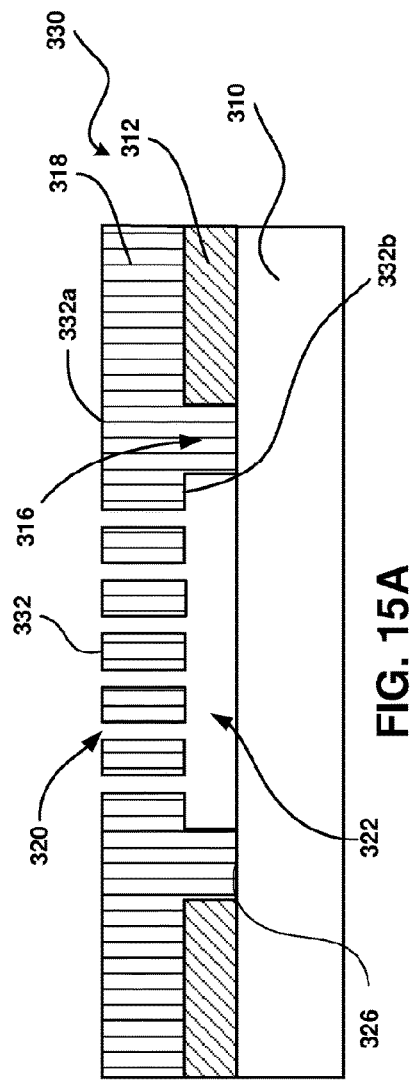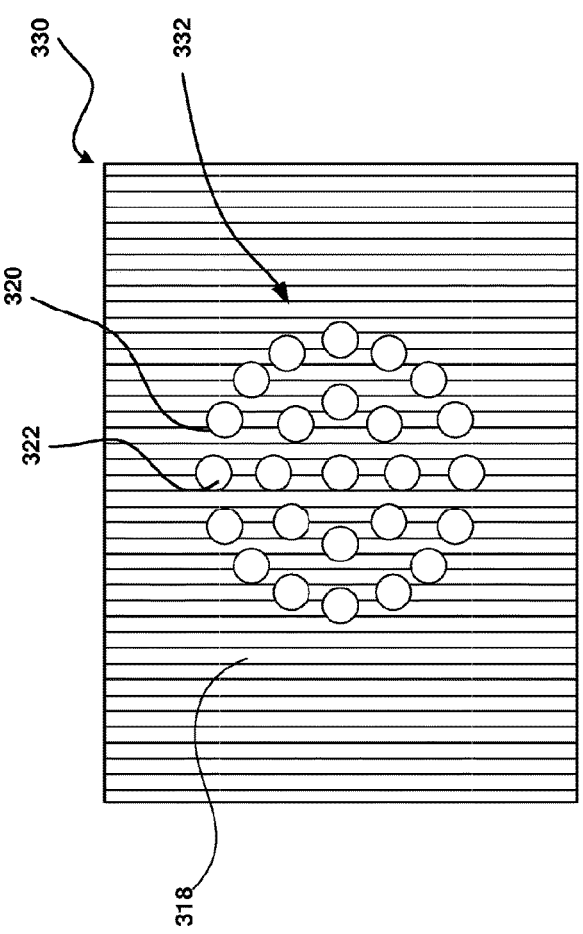

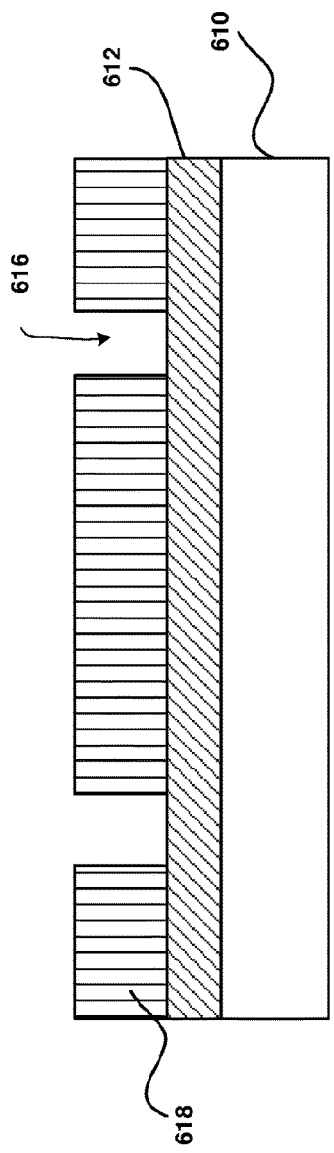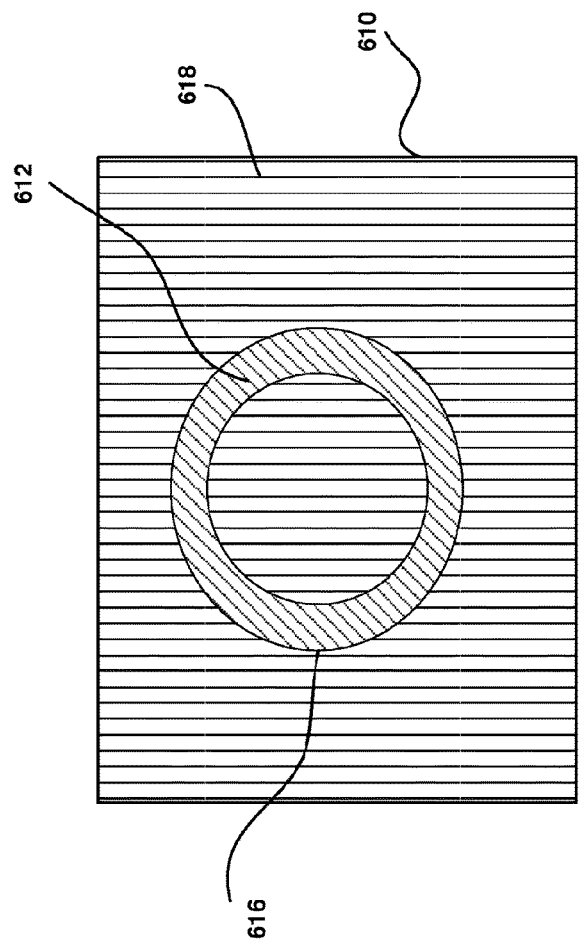
FIG. 23A
FIG. 23B

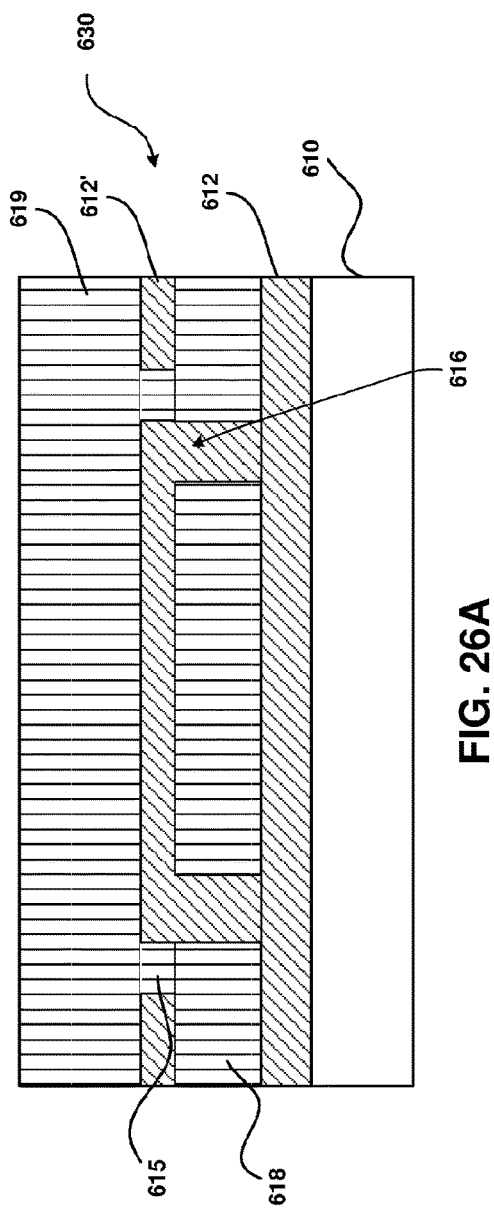
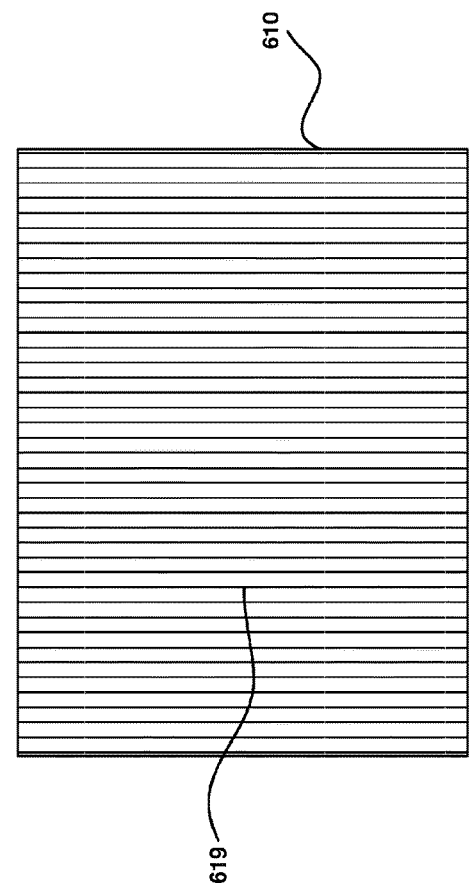
FIG. 26A
FIG. 26B

SYSTEM AND METHOD FOR MAINTAINING A SMOOTHED AND ANTI-STICTION SURFACE ON A MEMS DEVICE

CROSS-REFERENCE TO RELATED APPLICATION

This application is a 35 U.S.C. § 371 National Stage Application of PCT/EP2016/082813, filed on Dec. 29, 2016, which claims the benefit of priority to a U.S. provisional patent application Ser. No. 62/273,133, filed Dec. 30, 2015, the contents of which are incorporated herein by reference as if fully enclosed herein.

FIELD

The patent relates generally to microelectromechanical system (MEMS) devices and, more particularly, to a MEMS device with a smoothened epi-poly cap layer.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to systems and methods for maintaining a smoothened and anti-stiction surface on a cap layer for a MEMS device. For example, a device includes a substrate and a sacrificial layer deposited on the substrate. An etched structure is formed in the sacrificial layer during an etching process. A material such as a polysilicon layer is epitaxially grown in the etched structure and over the sacrificial layer, defines a cap layer. The device further undergoes another etching process by removing portions of one of the epi-polysilicon layer and the sacrificial layer to form a plurality of access openings. A cavity is formed by etching through one of the one of the epi-polysilicon layer and the sacrificial layer. The cavity is located beneath the access openings. A barrier layer formed from Aluminum Oxide ($Al_2O_3$) with a thickness is formed over the epi-poly cap layer, the access openings, and the cavity using ALD process. A refill material layer is epitaxially grown in the access openings until the access openings are sealed with the refill material. The refill material may be the same material as used as the cap layer material. In alternate embodiment, the refill material may be a different material from the cap layer material. A substantially smoothened and anti-stiction surface is maintained on the cap layer that has a reduced surface roughness. The use of the barrier layer prevents the polysilicon on the underside of the cap layer from migrating and forming a rough surface.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein:

FIG. 2A is a cross sectional view of an embodiment of a substrate for implementing a MEMS sensor after a deposition of a sacrificial layer in accordance with a described disclosure;

FIG. 2B is a top view of the substrate of FIG. 2A covered with the sacrificial layer;

FIG. 5A is a cross sectional view of the substrate of FIGS. 4A and 4B after portions of the epi-poly cap layer has been etched to form access openings;

FIG. 5B is a top view of the substrate of FIG. 5A with access openings formed in the epi-poly cap layer using a deep reactive ion etching (DRIE) process;

FIG. 6A is a cross sectional view of the substrate of FIGS. 5A and 5B after portions of the sacrificial layer have been etched to form a cavity between the epi-poly cap layer and the substrate and to release a membrane;

FIG. 6B is a top view of the substrate of FIG. 6A with the membrane suspended above the substrate after the cavity between the epi-poly cap layer and the substrate is formed using an etching process;

FIG. 8A is a cross sectional view of the substrate of FIGS. 7A and 7B after a portion of the barrier layer has been etched to expose a surface of the epi-poly cap layer;

FIG. 8B is a top view of the substrate of FIG. 8A with the surface of the epi-poly cap layer exposed;

FIG. 11A is a cross sectional view of another described example of a MEMS sensor including a sacrificial layer deposited on a substrate in accordance with a described disclosure;

FIG. 11B is a top view of the substrate of FIG. 11A covered with the sacrificial layer;

FIG. 12A is a cross sectional view of the substrate of FIG. 11A after a deposition of the sacrificial layer has been etched to form a structure defining a trench;

FIG. 12B is a top view of the substrate of FIG. 12A with an etched structure;

FIG. 14A is a cross section view of substrate of FIG. 13A after a portion of the epi-poly cap layer has been etched to form access openings;

FIG. 14B is a top view of the substrate of FIG. 14A with access openings;

FIG. 15A is a cross sectional view of the substrate of FIG. 14A after a deposition of the sacrificial layer has been etched to form a cavity between epi-poly cap layer and the substrate and to release a membrane;

FIG. 15B is a top view of the substrate of FIG. 15A with the membrane suspended above the substrate after the cavity between epi-poly cap layer and the substrate is formed using an etching process;

FIG. 23A is a cross sectional view of the substrate of FIGS. 22A and 22B after a portion of the epi-poly cap layer has been etched to form a first trench;

FIG. 23B is a top view of the substrate of FIG. 23A with a first trench formed after an etching process;

FIG. 26A is a cross sectional view of the substrate of FIG. 25A after a deposition of a refill material over the epi-poly cap layer;

FIG. 26B is a cross sectional view of the substrate of FIG. 25A covered with the refill material;

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
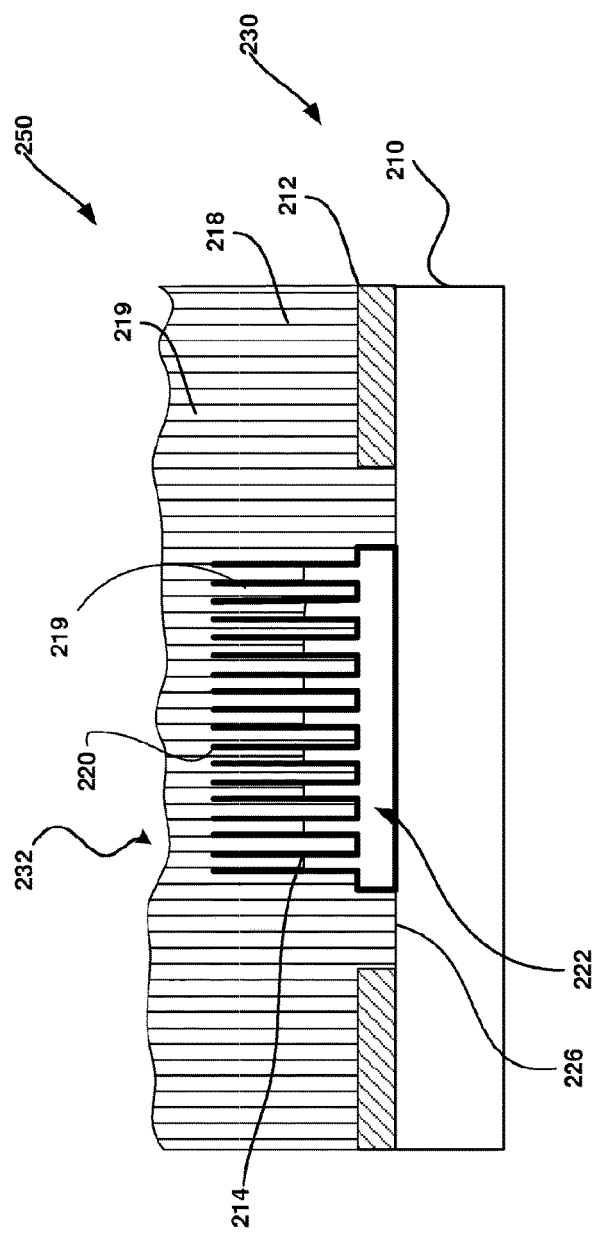
FIG. 1 is a cross sectional view of an exemplary embodiment of a MEMS device with a smoothened and anti-stiction surface in accordance with a disclosure.

FIG. 1 depicts another embodiment of a MEMS device 250 in accordance with the teachings of the disclosure. The device 250 includes a substrate 210 and an epi-poly cap layer 230. The substrate 210 comprises a silicon substrate or a silicon wafer. In alternate embodiments, the substrate 210 may comprise a silicon on insulator (SOI) substrate or oxidized substrate. The substrate 210 has a thickness between about 400 and 700 microns, but can be more or less, depending on the application. The epi-poly cap layer 230 is mounted on the substrate 210 by support structures 226 to form a gap or cavity 222 between the epi-poly cap layer 230 and the substrate 210. The epi-poly cap layer 230 comprises an epitaxial deposition of polysilicon 218 that forms a flexible membrane 232 suspended above the substrate 210 by the support structures 226. A sacrificial layer 212 is deposited on the substrate 210 using any conventional deposition techniques. The sacrificial layer 212 may be silicon dioxide ($SiO_2$) and is typically between about 0.5 micron and 2.0 microns in thickness, but can be more or less, depending on the application. The epi-poly cap layer 230 is deposited onto the sacrificial layer 212 which are then removed via access openings 220 to expose the cavity 222 and release the membrane 232.

A barrier layer 214 is deposited on the epi-poly cap layer 230, walls of the cavity 222, and walls of the access openings 220 using atomic layer deposition (ALD) which prevents an epitaxial deposition of polysilicon 219 formed over the epi-poly cap layer 230 and within the access openings 220 from migrating and forming rough surfaces on the epi-poly cap layer 230, walls of the cavity 222, and walls of the access openings 220. The barrier layer 214 may be non-porous Aluminum Oxide ($Al_2O_3$). Additional access openings formed through the cap layer 230 at an outer region of the cap layer also provide access to the sacrificial layer for the introduction of an etchant material. Forming the barrier layer 214 on the epi-poly cap layer 230, walls of the cavity 222, and walls of the access openings 220 preserves scallops. The MEMS device 250, depicted in FIG. 17, results in a smoothed and anti-stiction surface formed on the epi-poly cap layer 230.

A process for fabricating a MEMS device 250 having a smoothed surface formed on an epi-poly cap layer 230 will now be described with reference to FIGS. 2-9. As depicted in FIG. 2A, a sacrificial layer 212 is deposited on a substrate 210 using any conventional deposition techniques. The sacrificial layer 212 may be silicon dioxide ($SiO_2$) and is typically between about 0.5 micron and 2.0 microns in thickness, but can be more or less, depending on the application. The substrate 210 may be a portion of a larger substrate that is used to form a number of MEMS devices. The substrate 210 comprises a silicon substrate or a silicon wafer. In alternate embodiments, the substrate 210 may comprise a silicon on insulator (SOI) substrate or oxidized substrate. The substrate 210 has a thickness between about 400 and 700 microns, but can be more or less, depending on the application. As shown in FIG. 2B, the substrate 210 is covered with the sacrificial layer 212.

Figure 3A:
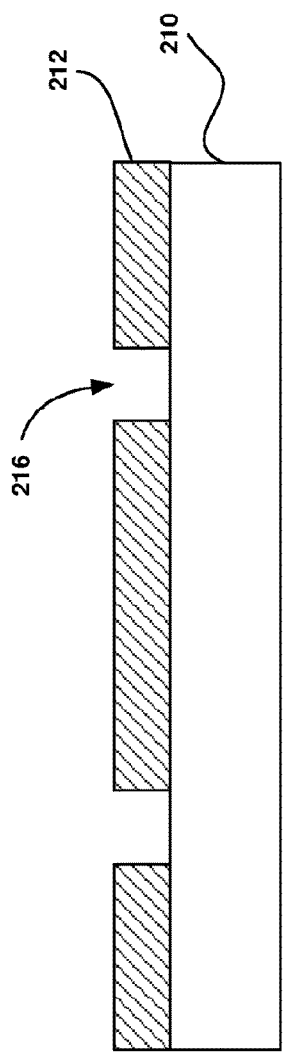
FIG. 3A is a cross sectional view of the substrate of FIGS. 2A and 2B after a portion of the sacrificial layer has been etched to form a structure defining a trench.
Figure 3B:
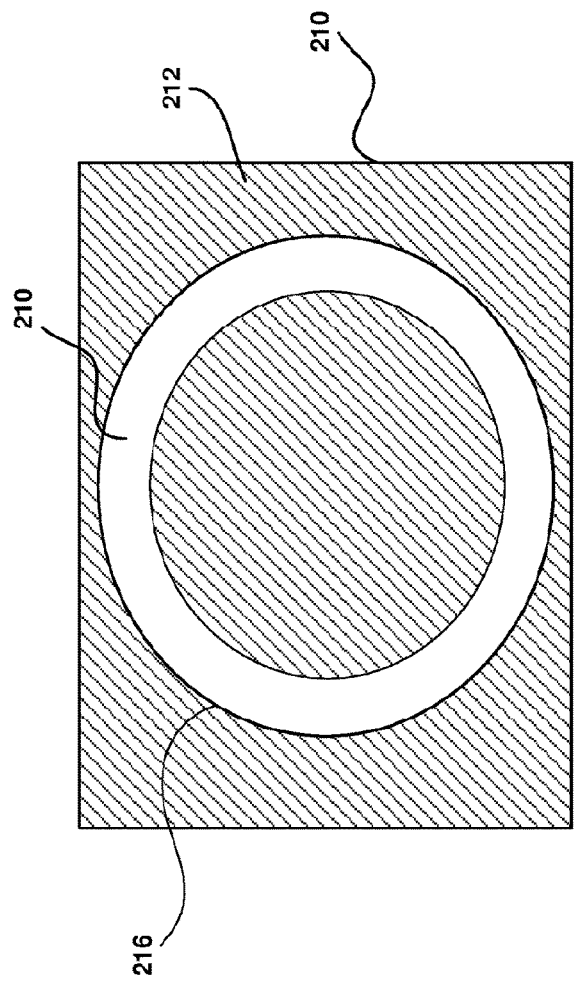
FIG. 3B is a top view of the substrate of FIG. 3A with an etched structure.

Referring to FIG. 3A, portion of the sacrificial layer 212 is etched using an etching technique until a surface of the substrate 210 is exposed to form a trench 216. The etching technique may be any standard semiconductor process, such as wet or dry etching, by laser etching, depending in part upon the nature of the application. FIG. 3B illustrates a top view of the substrate 210 with an etched structure defined by a trench 216 formed in the sacrificial layer 212 after an etching process. The trench 216 may be circular, rectangular, oval, square, or any other suitable shape. As one example, the trench 16 is round.

Figure 4A:
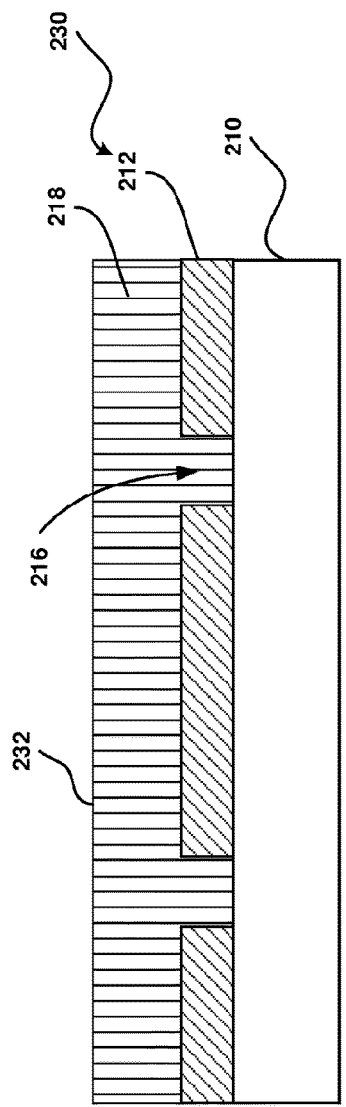
FIG. 4A is a cross sectional view of the substrate of FIGS. 3A and 3B after an epitaxial deposition of polysilicon material to cover the sacrificial layer and the trench.
Figure 4B:
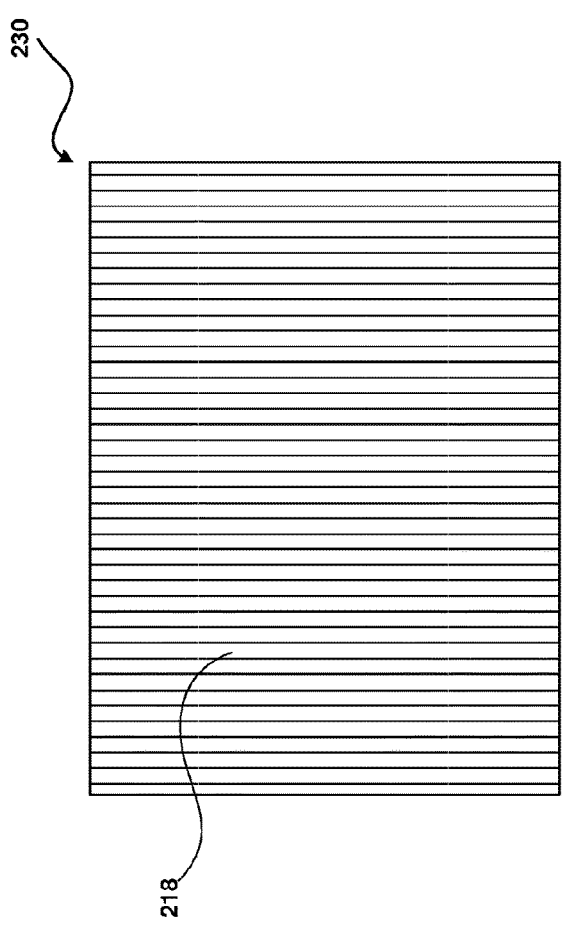
FIG. 4B is a top view of the substrate of FIG. 4A covered with polysilicon material.

Once the portion of the sacrificial layer 212 is removed to form the etched structure 216, the substrate 210 is placed in an epitaxial reactor for epitaxial growth. As shown in FIG. 4A, a material 218 such as a polysilicon layer grows epitaxially over the sacrificial layer 212 and the trench 216 which defines an epi-poly cap layer 230. In alternate embodiment, the material 218 may be doped or undoped polysilicon. The thickness and the doping concentrations of the epitaxial layer are determined by the type of application. In one embodiment, the epi-polysilicon cap layer 230 is typically 10 micron in thickness, but can be more or less, depending on the application. The material 218 formed within the trench 216 supports the epi-poly cap layer 230 after the epi-poly cap layer is released and releases a membrane 232 which will be described below. FIG. 4B illustrates a top view of the substrate 210 with a polysilicon layer 218 epitaxially grown over the sacrificial layer 212 and the etched structure 216.

Now referring to FIGS. 5A and 5B, an etching process such as deep reactive ion etching (DRIE) is used to remove portions of the epi-poly cap layer 230 down to the sacrificial layer 212 to form a plurality access openings 220. As depicted in FIG. 5A, the access openings 220 are formed through the membrane 232 of the epi-poly cap layer 230 to provide access to the sacrificial layer 212 for the introduction of an etchant material. FIG. 5B illustrates a top view of the substrate 210 with a plurality of access openings 220 formed though the membrane 232 of the epi-poly cap layer 230 down to the sacrificial layer 212.

The substrate 210 continues to undergo an etching process. As depicted in FIG. 6A, a vHF acid is introduced via the access opening 220 formed within the epi-poly cap layer 230 to dissolve a portion of the sacrificial layer 212 beneath the access opening 220 until a cavity 222 is formed between the substrate 210 and the epi-poly cap layer 230 and release the membrane 232. The membrane 232 of the epi-poly cap layer 230 suspended above the substrate 210 is supported by a support structure 226 formed by the trench 216 filled with polysilicon material 218. In alternate embodiments, the cavity 222 may be in proximal to the openings 220. The flexible membrane 232 includes a first surface 232a and a second surface 232b. The first surface 232a faces away from the substrate 210 and the second surface 232b faces toward the substrate 210. FIG. 6B illustrates a top view of the substrate 210 with the cavity 222 formed after the etching process.

Figure 7A:
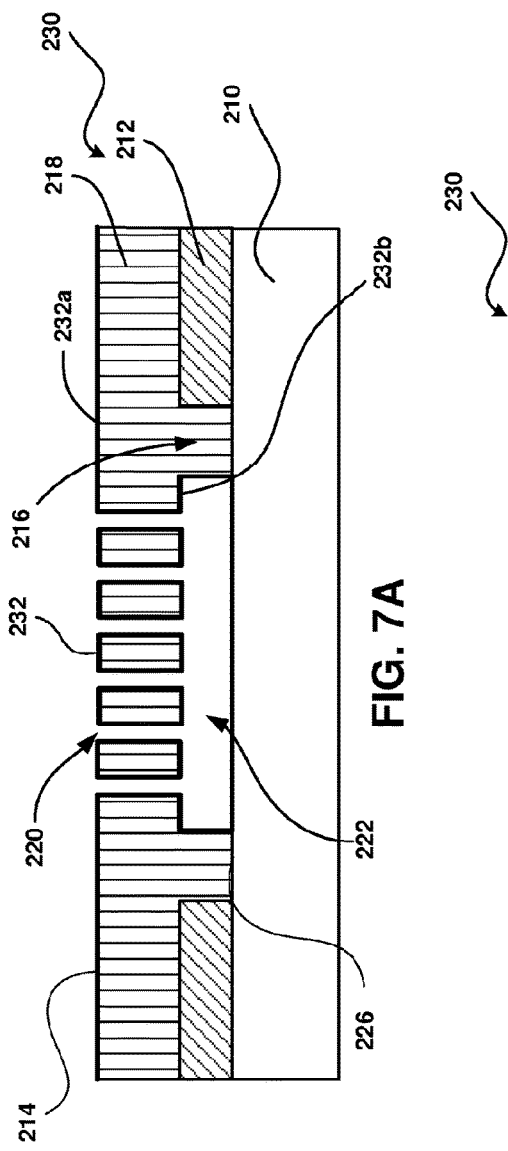
FIG. 7A is a cross sectional view of the substrate of FIGS. 6A and 6B after a deposition of a barrier layer.
Figure 7B:
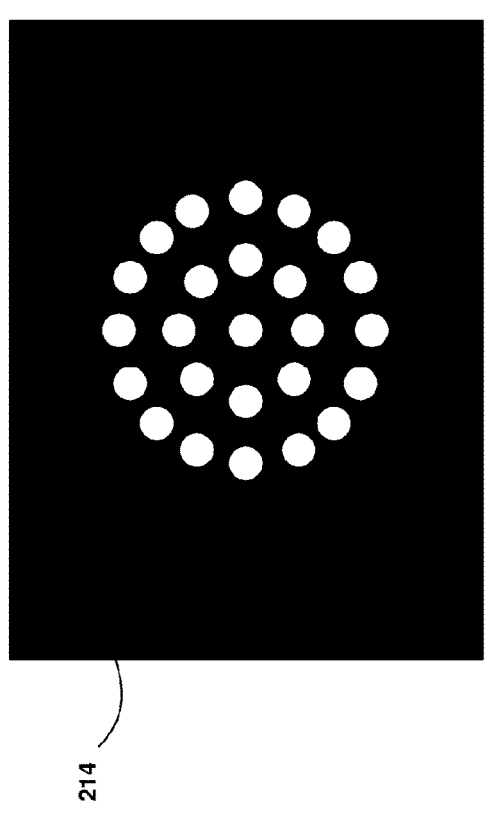
FIG. 7B is a top view of the substrate of FIG. 7A covered with the barrier layer.

A barrier layer 214 is deposited on the epi-poly cap layer 230, first and second surfaces 232a, 232b of the membrane 232, first, second, and third surfaces 212a, 212b, 212c of the substrate 210 that form a portion of the cavity 222, and walls 220a of the access openings 220 using atomic layer deposition (ALD), as depicted in FIG. 7A. The barrier layer 214 may be non-porous Aluminum Oxide ($Al_2O_3$). The thickness of the barrier layer 214 deposited on the sacrificial layer 212 can be precisely controlled via the ALD process. In alternate embodiments, the barrier layer 214 may comprise materials with characteristics that are resistant to vapor hydrofluoric (vHF) acid during the fabrication process at an elevated high temperature. In one embodiment, the temperature may be at least 850° C. The alternate materials that withstand high temperature during epitaxial growth process may also be used as a barrier layer. Forming the barrier layer 214 on the exposed surfaces 232a, 232b, 212a, 212b, 212c, and 220a preserves scallops and enables anti-stiction. FIG. 7B illustrates a top view of the substrate 210 covered by the barrier layer 214.

Now referring to FIGS. 8A and 8B, the barrier layer 214 deposited on the surface 232a is etched using any types of etching technique until the surface 232a is once again exposed.

Figure 9:
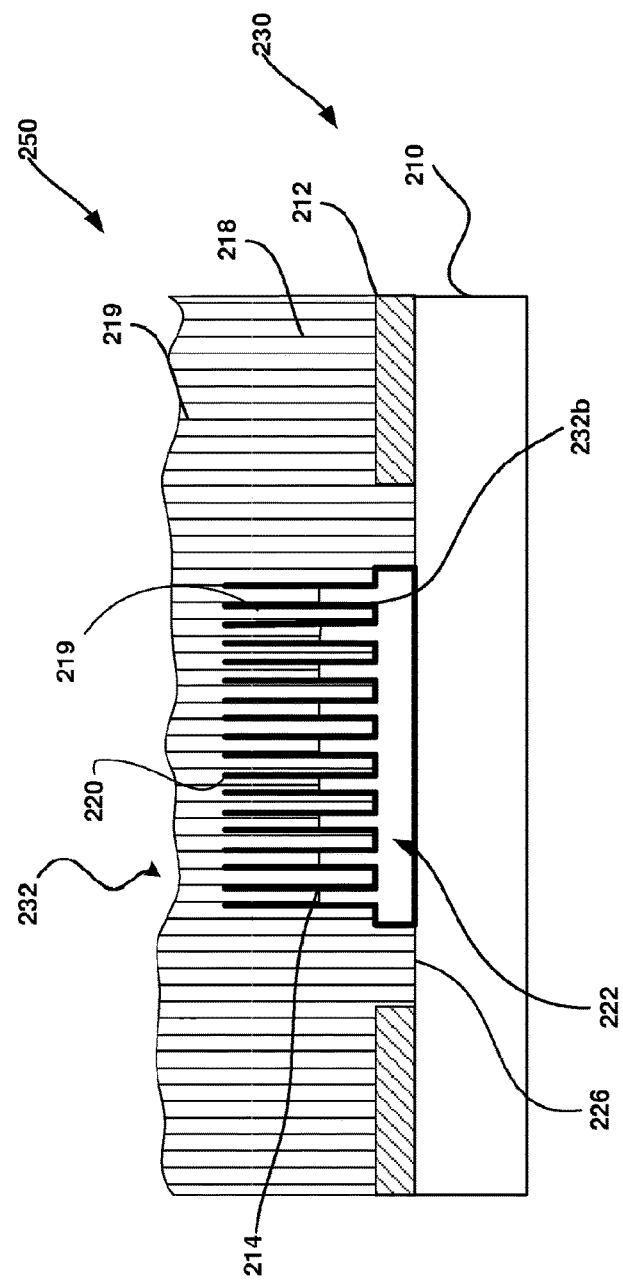
FIG. 9 is a cross sectional view of the substrate of FIGS. 8A and 8B after a deposition of a refill material over the epi-poly cap layer to form the MEMS device.

The substrate 210 is then placed in the epitaxial reactor again for epitaxial growth. During this process, a refill material 219 grows in the access openings 220 as depicted in FIG. 9. In one embodiment, the refill material 219 may be polysilicon layer. In an alternate embodiment, the refill material 219 grown in the access openings 220 may be different from the cap layer material 218 grown on the substrate 210. As shown in FIG. 9, the epi-polysilicon 219 is partially grown in and closes the access openings 220 to seal the cavity 222. In some embodiments, the epi-polysilicon 219 is grown from outer ends of the access openings 220 and terminated at inner ends of the access openings near the cavity 222 to close the access openings 220 and seal the cavity 222. The resulting MEMS device has a reduced surface roughness and anti-stiction surface formed on the epi-poly cap layer 230 and refill epi-polysilicon layers 218, 219, i.e. an epitaxially growth to close the access openings 220 and seal the cavity 222. The use of the barrier layer 214 during the etching process prevents the silicon on the underside of the epi-polysilicon layers 218, 219 from migrating and forming a rough surface on the second surface 232b of the membrane 232.

Figure 10:
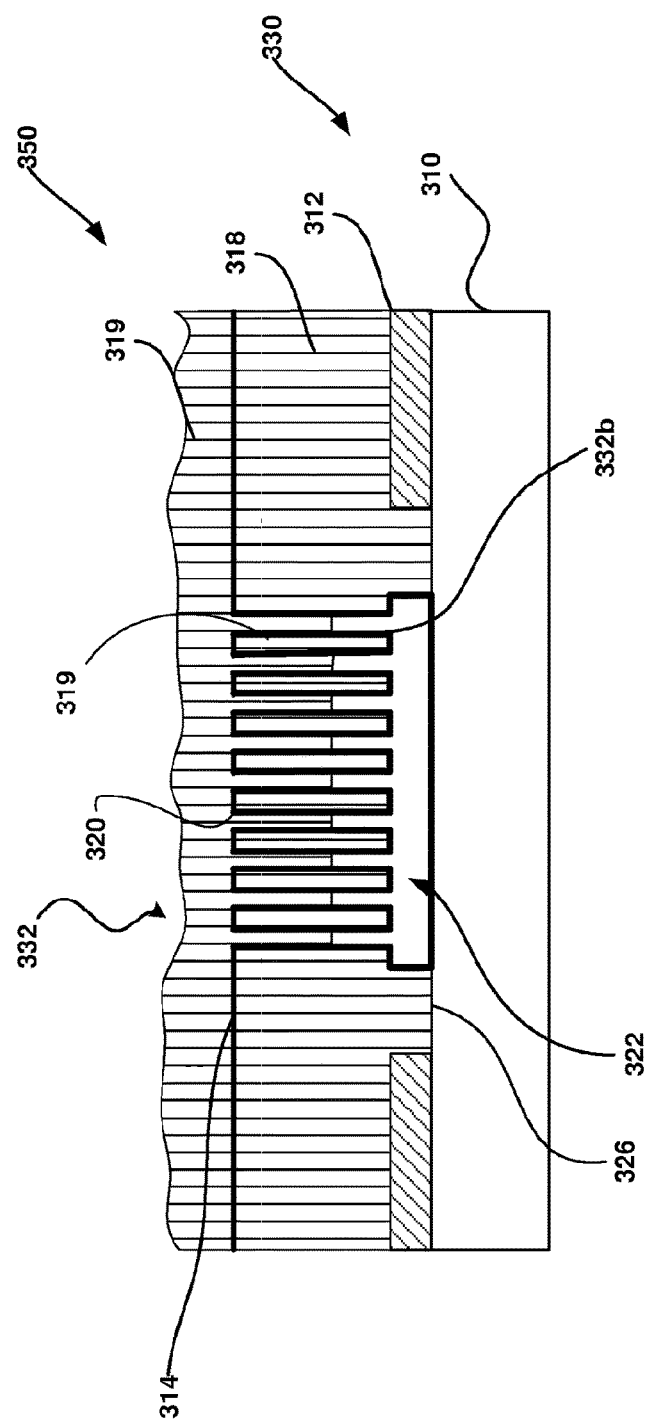
FIG. 10 is a cross sectional view of another described embodiment of a MEMS device with a smoothened surface in accordance with a disclosure.

FIG. 10 depicts another embodiment of a MEMS device 350 in accordance with the teachings of the disclosure. The device 350 includes a substrate 310 and an epi-poly cap layer 330. The substrate 310 comprises a silicon substrate or a silicon wafer. In alternate embodiments, the substrate 310 may comprise a silicon on insulator (SOI) substrate or oxidized substrate. The substrate 310 has a thickness between about 400 and 700 microns, but can be more or less, depending on the application. The epi-poly cap layer 330 is mounted on the substrate 310 by support structures 326 to form a gap or cavity 322 between the epi-poly cap layer 330 and the substrate 310. The epi-poly cap layer 330 comprises an epitaxial deposition of polysilicon 318 that forms a flexible membrane 332 suspended above the substrate 310 by the support structures 326. A sacrificial layer 312 is deposited on the substrate 310 using any conventional deposition techniques. The sacrificial layer 312 may be silicon dioxide ($SiO_2$) and is typically between about 0.5 micron and 2.0 microns in thickness, but can be more or less, depending on the application. The epi-poly cap layer 330 is deposited onto the sacrificial layer 312 which are then removed via access openings 320 to expose the cavity 322 and release the membrane 332.

A barrier layer 314 is deposited on the epi-poly cap layer 330, walls of the cavity 322, and walls of the access openings 320 using atomic layer deposition (ALD) which prevents an epitaxial deposition of polysilicon 319 formed within the access openings 320 from migrating and forming rough surfaces on the epi-poly cap layer 330, walls of the cavity 322, and walls of the access openings 320. The barrier layer 314 may be non-porous Aluminum Oxide ($Al_2O_3$). Additional access openings formed through the cap layer 230 at an outer region of the cap layer also provide access to the sacrificial layer for the introduction of an etchant material.

Unlike from the MEMS device 250 where a portion of the barrier layer 214 formed on the epi-poly cap layer 230 is etched to expose the surface of the epi-poly cap layer 230. The barrier layer 314 of the MEMS device 350 in FIG. 10 formed on the epi-poly cap layer 330 is not etched nor removed before the epitaxial deposition of polysilicon 319 on the entire surface of the barrier layer 314. Forming the barrier layer 314 on the epi-poly cap layer 330, walls of the cavity 322, and walls of the access openings 320 preserves scallops. The MEMS device 350, depicted in FIG. 26, results in a smoothed and anti-stiction surface roughness formed on the epi-poly cap layer 330, walls of the cavity 322, and walls of the access openings 320.

A process for fabricating a MEMS device 350 having a smoothed surface formed on an epi-poly cap layer 330 will now be described with reference to FIGS. 11-17. As depicted in FIG. 11A, a sacrificial layer 312 is deposited on a substrate 310 using any conventional deposition techniques. The sacrificial layer 312 may be silicon dioxide ($SiO_2$) and is typically between about 0.5 micron and 2.0 microns in thickness, but can be more or less, depending on the application. The substrate 310 may be a portion of a larger substrate that is used to form a number of MEMS devices. The substrate 310 comprises a silicon substrate or a silicon wafer. In alternate embodiments, the substrate 310 may comprise a silicon on insulator (SOI) substrate or oxidized substrate. The substrate 310 has a thickness between about 400 and 700 microns, but can be more or less, depending on the application. As shown in FIG. 11B, the substrate 310 is covered with the sacrificial layer 312.

Referring to FIG. 12A, portion of the sacrificial layer 312 is etched using an etching technique until a surface of the substrate 310 is exposed to form a trench 316. The etching technique may be any standard semiconductor process, such as wet or dry etching, by laser etching, depending in part upon the nature of the application. FIG. 12B illustrates a top view of the substrate 310 with an etched structure defined by a trench 316 formed in the sacrificial layer 312 after an etching process. The trench 316 may be circular, rectangular, oval, square, or any other suitable shape. As one example, the trench 316 is round.

Figure 13A:
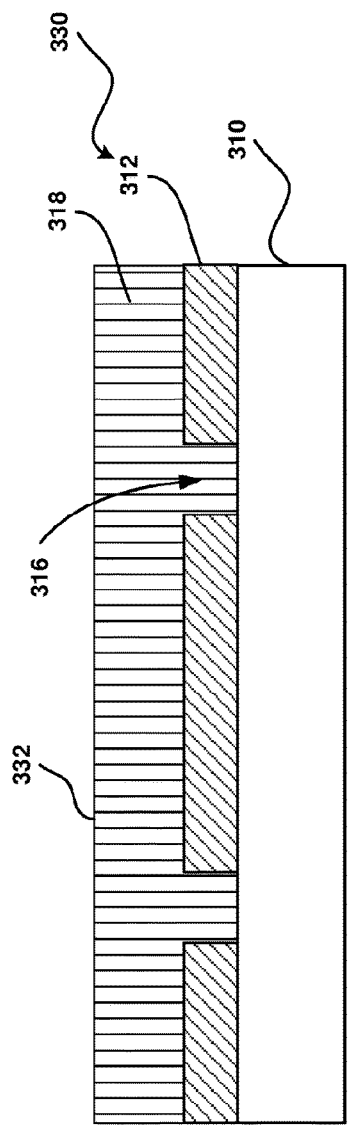
FIG. 13A is a cross sectional view of the substrate of FIG. 12A after an epitaxial deposition of polysilicon material to cover the sacrificial layer and the trench.
Figure 13B:
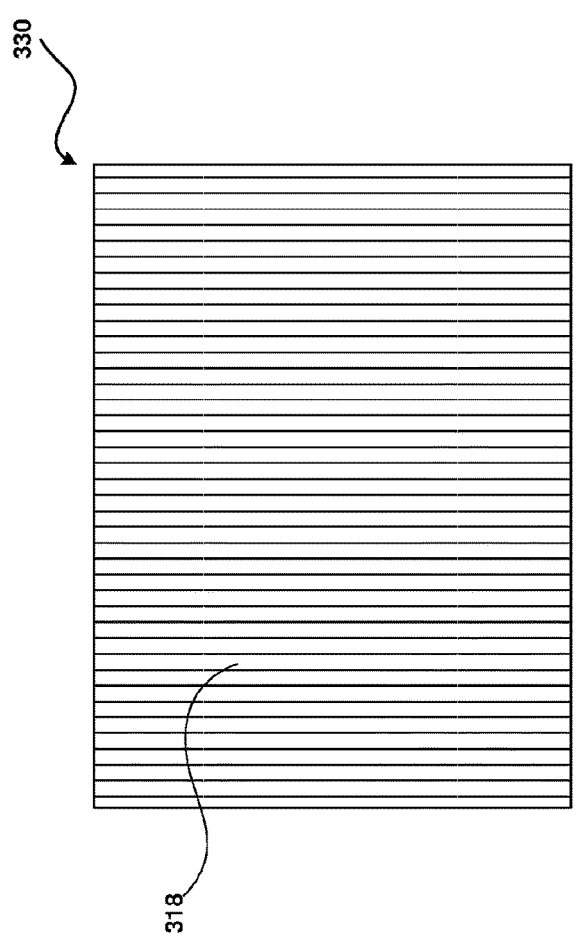
FIG. 13B is a top view of the substrate of FIG. 13A covered with polysilicon material.

Once the portion of the sacrificial layer 312 is removed to form the etched structure 316, the substrate 310 is placed in an epitaxial reactor for epitaxial growth. As shown in FIG. 13A, a material 318 such as a polysilicon layer grows epitaxially over the sacrificial layer 312 and the trench 316 which defines an epi-poly cap layer 330. In alternate embodiment, the material 318 may be doped or undoped polysilicon. The thickness and the doping concentrations of the epitaxial layer are determined by the type of application. In one embodiment, the epi-polysilicon cap layer 330 is typically 10 micron in thickness, but can be more or less, depending on the application. The material 318 formed within the trench 316 supports the epi-poly cap layer 330 after the epi-poly cap layer is released and releases a membrane 332 which will be described below. FIG. 13B illustrates a top view of the substrate 310 with a polysilicon layer 318 epitaxially grown over the sacrificial layer 312 and the etched structure 316.

Now referring to FIGS. 14A and 14B, an etching process such as deep reactive ion etching (DRIE) is used to remove portions of the epi-poly cap layer 330 down to the sacrificial layer 312 to form a plurality access openings 320. As depicted in FIG. 14A, the access openings 320 is formed through the membrane 332 of the epi-poly cap layer 330 to provide access to the sacrificial layer 312 for the introduction of an etchant material. FIG. 14B illustrates a top view of the substrate 310 with a plurality of access openings 320 formed though the membrane 332 of the epi-poly cap layer 330 down to the sacrificial layer 312.

The substrate 310 continues to undergo an etching process. As depicted in FIG. 15A, a vHF acid is introduced via the access opening 320 formed within the epi-poly cap layer 330 to dissolve a portion of the sacrificial layer 312 beneath the access opening 320 until a cavity 322 is formed between the substrate 310 and the epi-poly cap layer 330 and release the membrane 332. The membrane 332 of the epi-poly cap layer 330 suspended above the substrate 310 is supported by a support structure 326 formed by the trench 316 filled with polysilicon material 318. In alternate embodiments, the cavity 322 may be in proximal to the openings 320. The flexible membrane 332 includes a first surface 332a and a second surface 332b. The first surface 332a faces away from the substrate 310 and the second surface 332b faces toward the substrate 310. FIG. 15B illustrates a top view of the substrate 310 with the cavity 322 formed after the etching process.

Figure 16A:
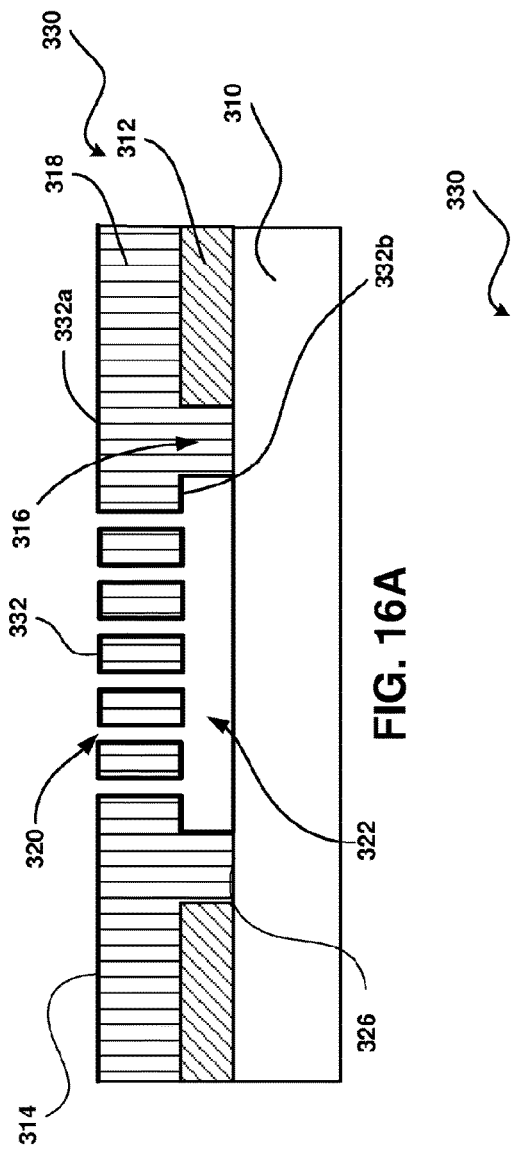
FIG. 16A is a cross sectional view of the substrate of FIG. 15A after a deposition of a barrier layer.
Figure 16B:
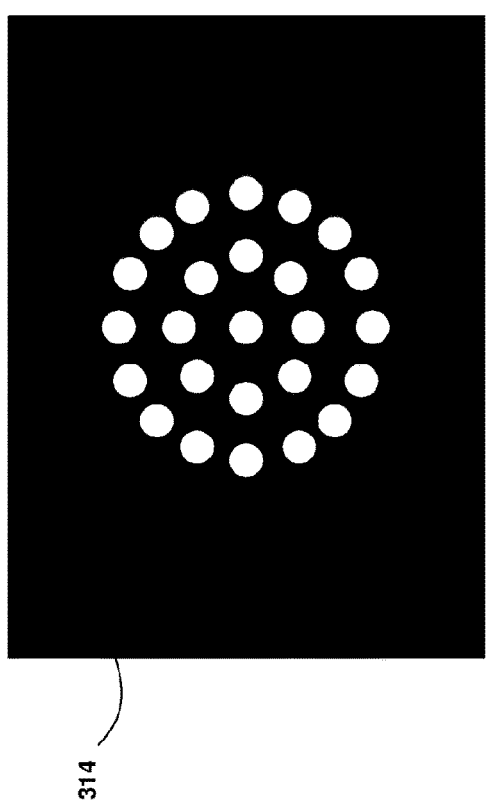
FIG. 16B is a top view of the substrate of FIG. 16A covered with the barrier layer.

A barrier layer 314 is deposited on the epi-poly cap layer 330, first and second surfaces 332a, 332b of the membrane 332, inner walls of the cavity 322, and walls of the access openings 320 using atomic layer deposition (ALD), as depicted in FIG. 16A. The barrier layer 314 may be non-porous Aluminum Oxide ($Al_2O_3$). The thickness of the barrier layer 314 deposited on the sacrificial layer 312 can be precisely controlled via the ALD process. In alternate embodiments, the barrier layer 314 may comprise materials with characteristics that are resistant to vapor hydrofluoric (vHF) acid during the fabrication process at an elevated high temperature. In one embodiment, the temperature may be at least 850° C. The alternate materials that withstand high temperature during epitaxial growth process may also be used as a barrier layer. Forming the barrier layer 314 on the exposed surfaces preserves scallops and enables anti-stiction. FIG. 16B illustrates a top view of the substrate 310 covered by the barrier layer 314.

Figure 17:
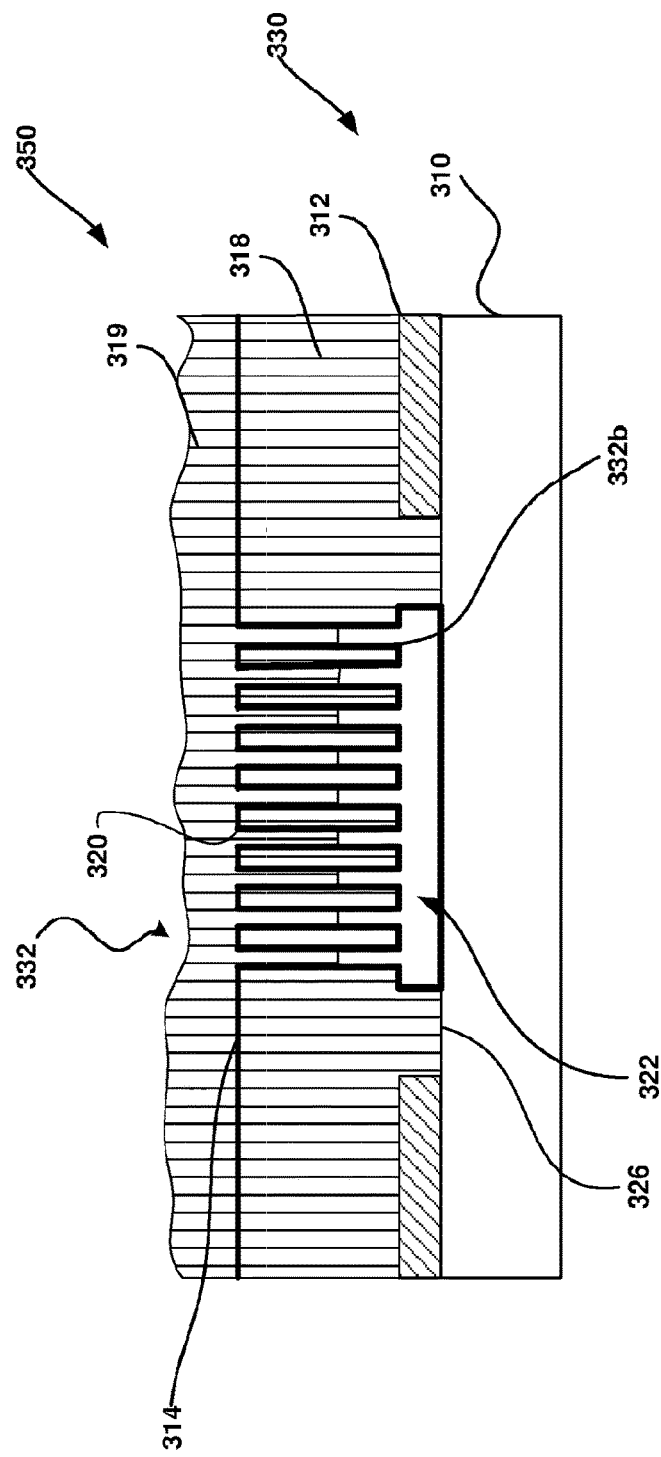
FIG. 17 is a cross sectional view of the substrate of FIG. 16A after a deposition of a refill material over the epi-poly cap layer to form the MEMS device.

The substrate 310 is then placed in the epitaxial reactor again for epitaxial growth. During this process, a refill material 319 grows over the barrier layer 314 and into the access openings 320 as depicted in FIG. 17. In one embodiment, the refill material 319 may be polysilicon layer. In an alternate embodiment, the refill material 319 grown in the access openings 320 may be different from the cap layer material 318 grown on the substrate 310. As shown in FIG. 17, the epi-polysilicon 319 is partially grown in and closes the access openings 320 to seal the cavity 322. In some embodiments, the epi-polysilicon 319 is grown from outer ends of the access openings 320 and terminated at inner ends of the access openings near the cavity 322 to close the access openings 320 and seal the cavity 322. The resulting MEMS device has a reduced surface roughness and anti-stiction surface formed on the epi-poly cap layer 330 and refill epi-polysilicon layers 318, 319, i.e. an epitaxially growth to close the access openings 320 and seal the cavity 322. The use of the barrier layer 314 prevents the silicon on the underside of the epi-polysilicon layers 318, 319 from migrating and forming a rough surface on the second surface 332b of the membrane 332.

Figure 18:
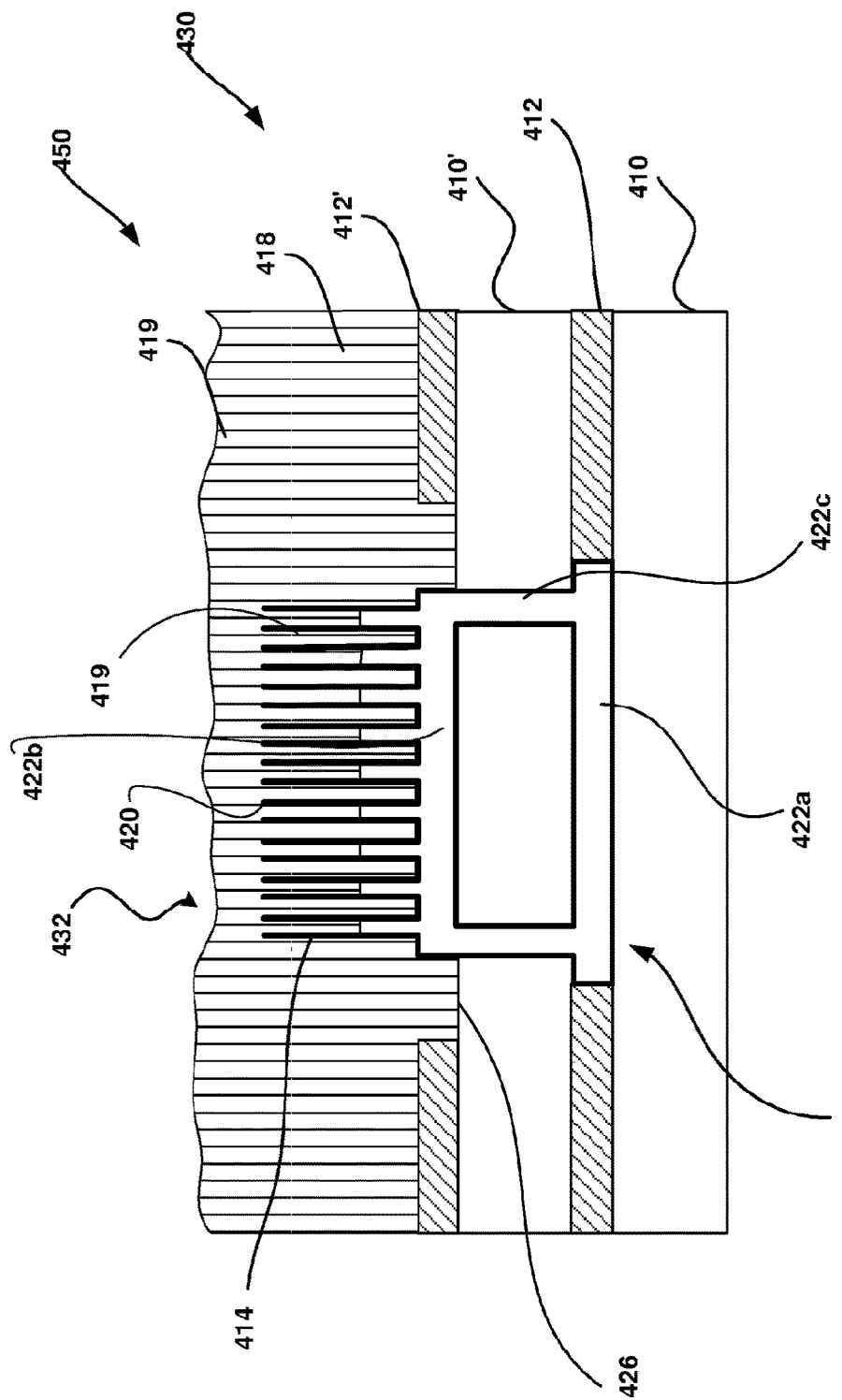
FIG. 18 is a cross sectional view of another described embodiment of a MEMS device with a smoothened and anti-stiction surface in accordance with a disclosure.

FIG. 18 depicts another embodiment of a MEMS device 450 having a stacked substrate in accordance with the teachings of the disclosure. The MEMS device 450 is similar to the MEMS device 250 as illustrated in FIG. 1, except, the MEMS device 450 comprises a second substrate 410' and a second sacrificial layer 412' disclosed on a first substrate 410 partially covered by a first sacrificial layer 412. A trench assembly 422 includes first trench 422a, a second trench 422b, and a third trench 422c. The first and second trench 422a, 422b are formed after portions of the first and second sacrificial layers 412, 412' are etched. The third trench 422c is formed within the second substrate 410' and having a first end fluidly connected to the first trench 422a and a second end fluidly connected to the second trench 422b.

Figure 19:
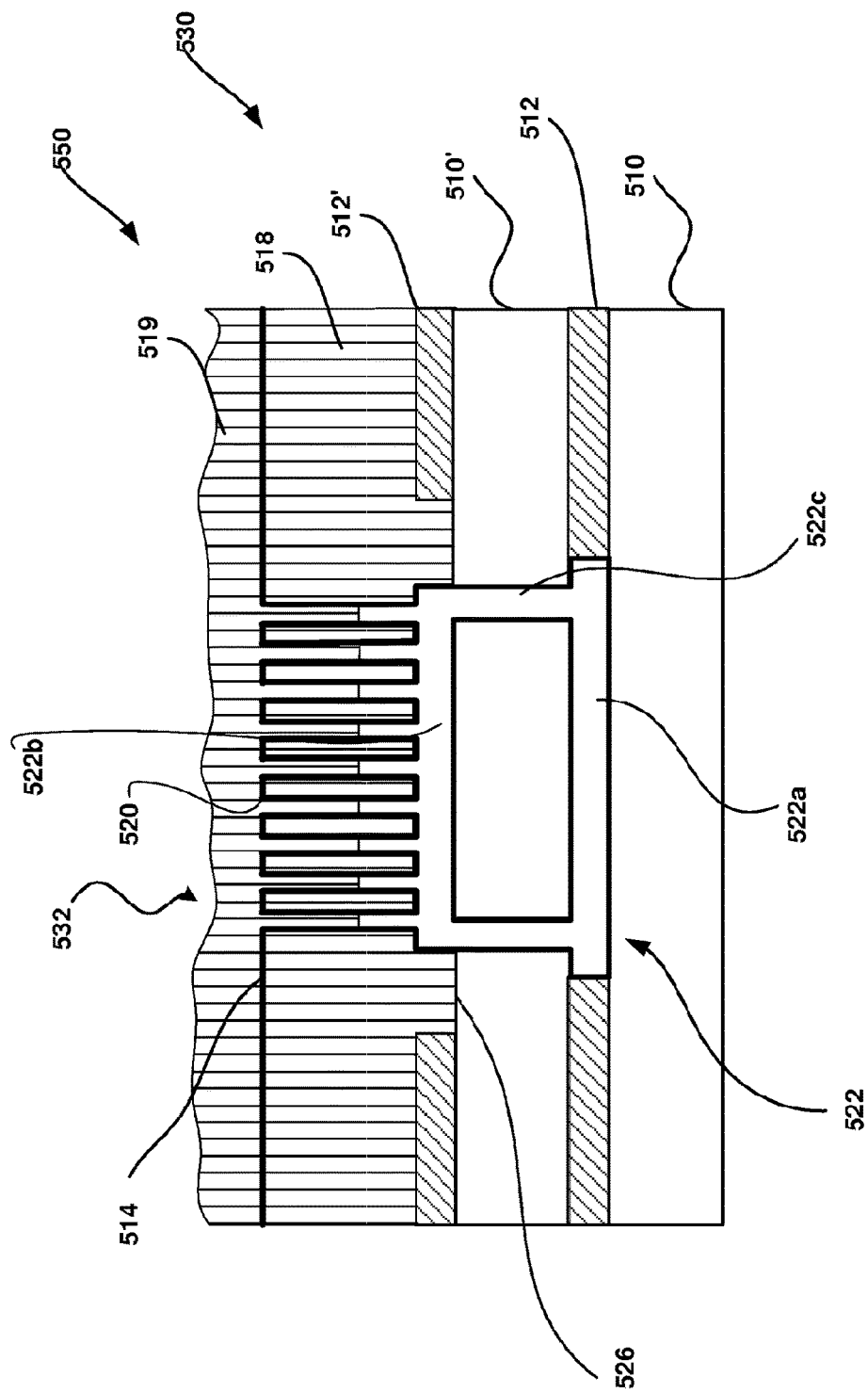
FIG. 19 is a cross sectional view of another described embodiment of a MEMS device with a smoothened and anti-stiction surface in accordance with a disclosure.

FIG. 19 depicts another embodiment of a MEMS device 550 having a stacked substrate in accordance with the teachings of the disclosure. The MEMS device 550 is similar to the MEMS device 450 as illustrated in FIG. 18, except, a barrier layer 514 is not etched before an epitaxial deposition of a refill material 519 over an epi-poly cap layer 530 and access openings 520.

Figure 20:
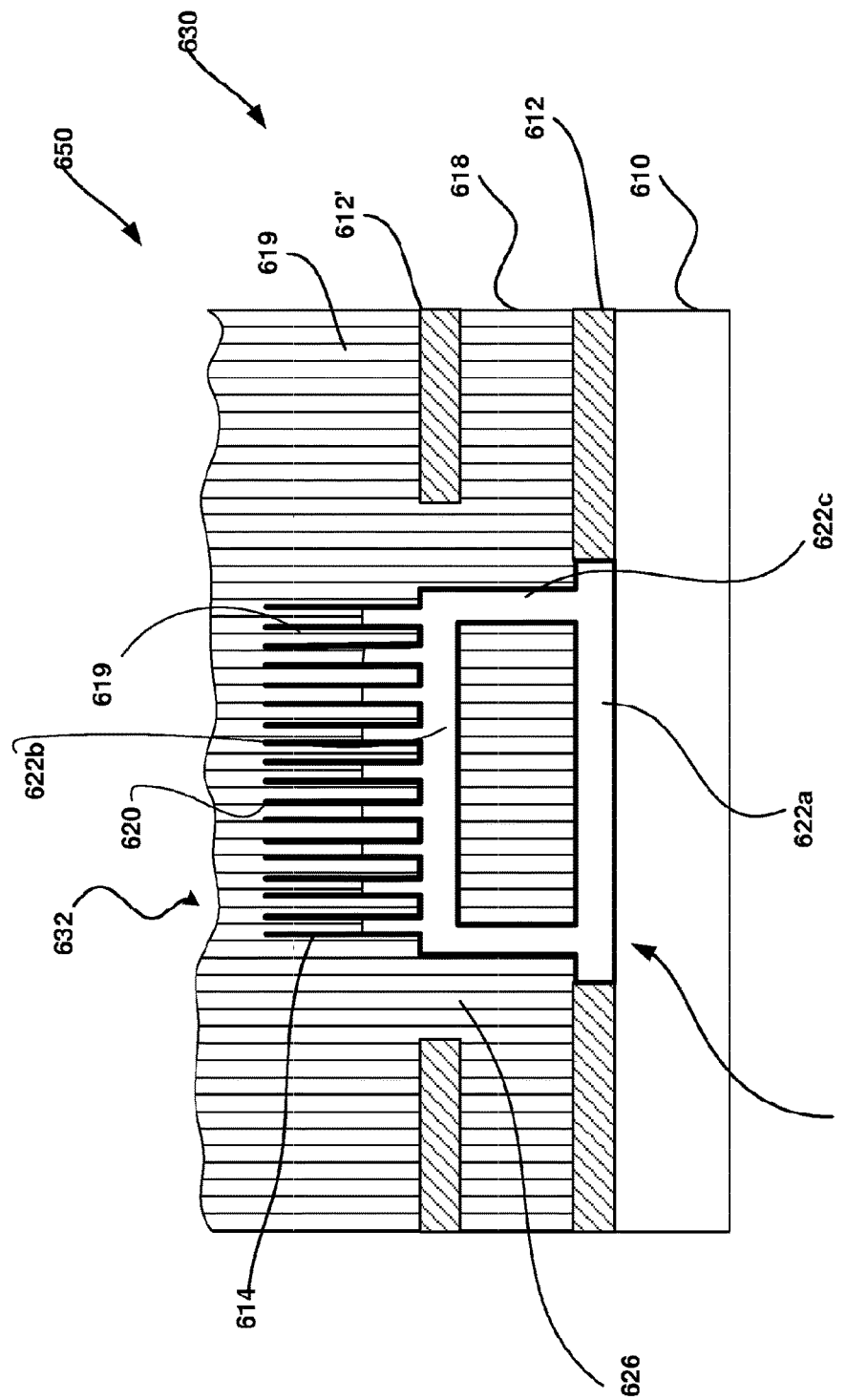
FIG. 20 is a cross sectional view of another described embodiment of a MEMS device with a smoothened and anti-stiction surface in accordance with a disclosure.

FIG. 20 depicts another embodiment of a MEMS device 650 in accordance with the teachings of the disclosure. The MEMS device 650 is similar to the MEMS device 250 as illustrated in FIG. 1, except, the MEMS device 650 comprises a second sacrificial layer 612' disclosed on a single substrate 410 covered by a first sacrificial layer 612 and first polysilicon material 618. A trench assembly 622 includes first trench 622a, a second trench 622b, and a third trench 622c. The first and second trench 622a, 622b are formed after portions of the first and second sacrificial layers 612, 612' are etched. The third trench 622c is formed within the first polysilicon material 618 and having a first end fluidly connected to the first trench 622a and a second end fluidly connected to the second trench 622b.

Figure 21A:
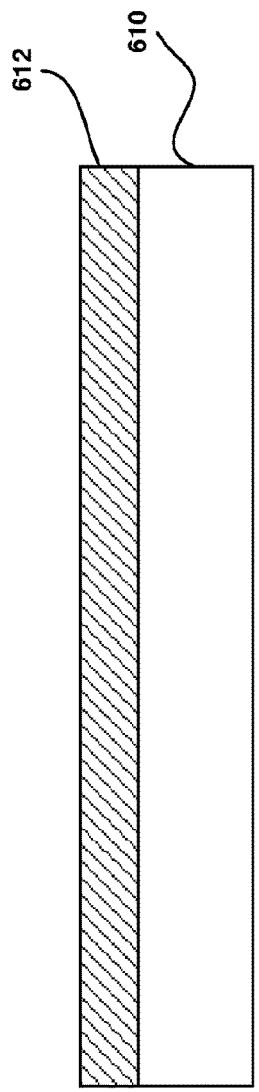
FIG. 21A is a cross sectional view of a substrate of FIG. 20 after a deposition of a first sacrificial layer in accordance with a described disclosure.
Figure 21B:
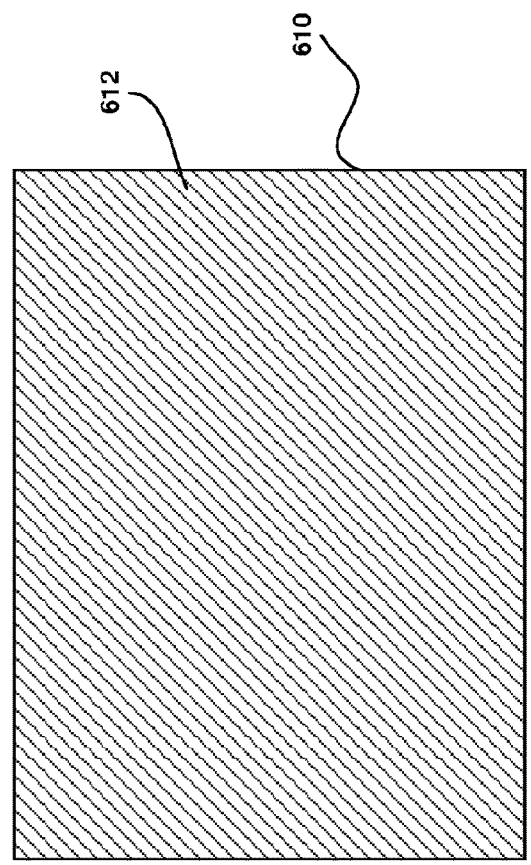
FIG. 21B is a top view of the substrate of FIG. 21A covered with the first sacrificial layer.

A process for fabricating a MEMS device 650 having a smoothed surface formed on an epi-poly cap layer 630 will now be described with reference to FIGS. 21-30. As depicted in FIG. 21A, a sacrificial layer 612, is deposited on a substrate 610 using any conventional deposition techniques, respectively. The sacrificial layer 612 may be silicon dioxide ($SiO_2$) and is typically between about 0.5 micron and 2.0 microns in thickness, but can be more or less, depending on the application. The substrate 610 may be a portion of a larger substrate that is used to form a number of MEMS devices. The substrate 610 comprises silicon substrates or silicon wafers. In alternate embodiments, the substrate 610 may comprise silicon on insulator (SOI) substrate or oxidized substrate. The substrate 610 has a thickness between about 400 and 700 microns, but can be more or less, depending on the application. As shown in FIG. 21B, the substrate 610 is covered with the sacrificial layer 612.

Figure 22A:
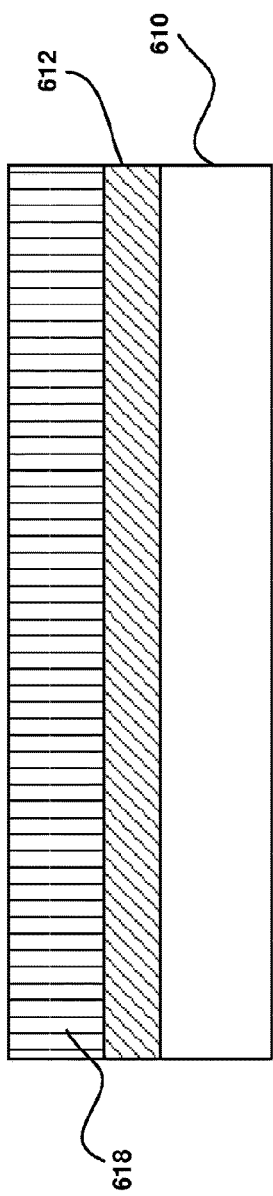
FIG. 22A is a cross sectional view of a substrate of FIG. 21A after an epitaxial deposition of polysilicon material to cover the first sacrificial layer.
Figure 22B:
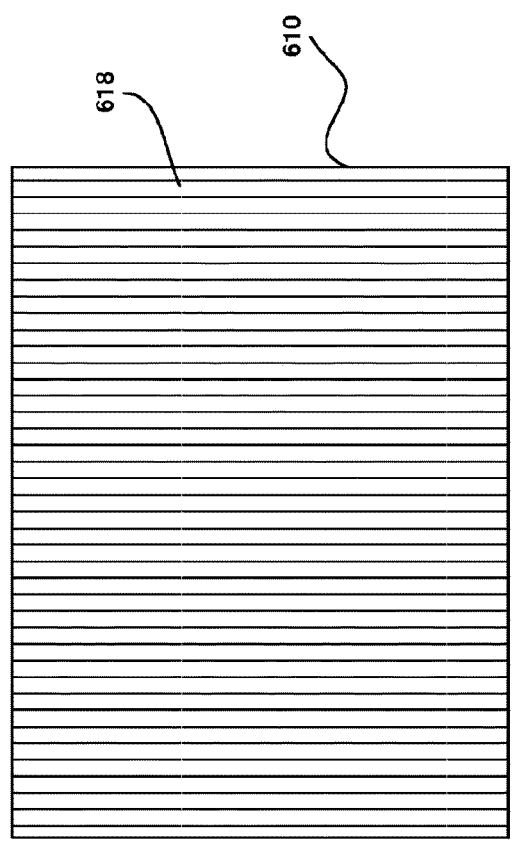
FIG. 22B is a top view of the substrate of FIG. 22A covered with the polysilicon material.
Figure 24A:
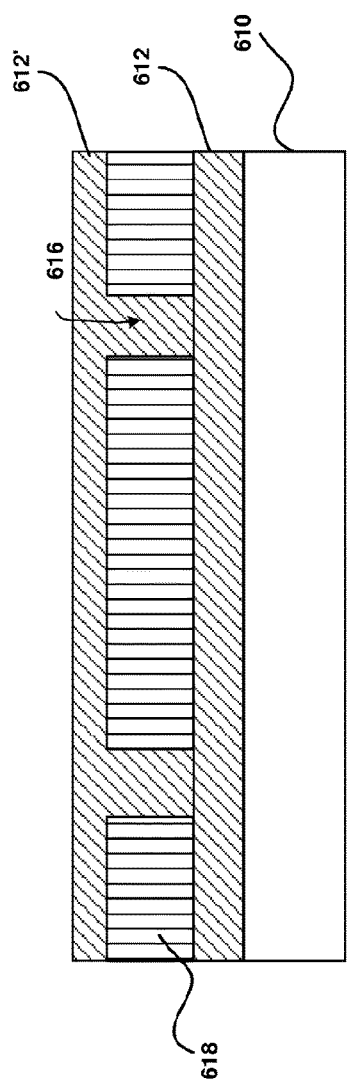
FIG. 24A is a cross sectional view of the substrate of FIGS. 23A and 23B after a deposition of a second sacrificial layer to cover the epi-poly cap layer and fill the first trench.
Figure 24B:
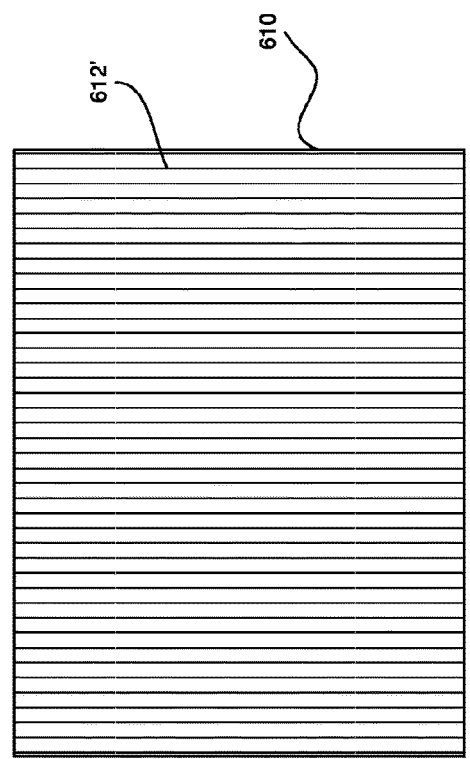
FIG. 24B is a top view of the substrate of FIG. 24A covered with the second sacrificial layer.

Referring now to FIGS. 22A and 22B, a material 618 such as polysilicon layer grows epitaxially over the sacrificial layer 612. In some embodiments, the material 618 may be doped or undoped polysilicon. The thickness and the doping concentrations of the epitaxial layer are determined by the type of application.

Portions of the polysilicon material 618 is etched down to the substrate 410 using an etching technique until a trench 616 is formed, as depicted in FIG. 23A. The etching technique may be any standard semiconductor process, such as wet or dry etching, by laser etching, depending in part upon the nature of the application. FIG. 23B illustrates a top view of the substrate 610 with an etched structure defined by a trench 616 formed in the polysilicon material 618. The trench 616 may be circular, rectangular, oval, square, or any other suitable shape. As illustrated, the trench 616 is a circular shape trench.

Figure 25A:
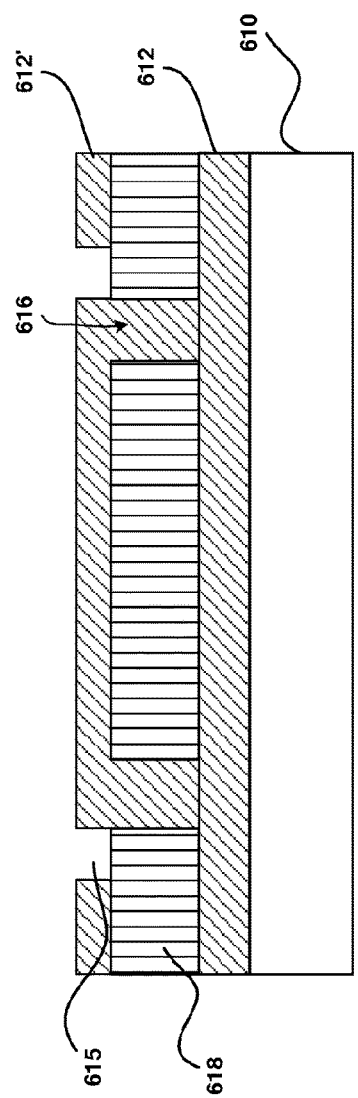
FIG. 25A is a cross sectional view of the substrate of FIGS. 24A and 24B after a portion of the second sacrificial layer has been etched to form a second trench adjacent to the first trench.
Figure 25B:
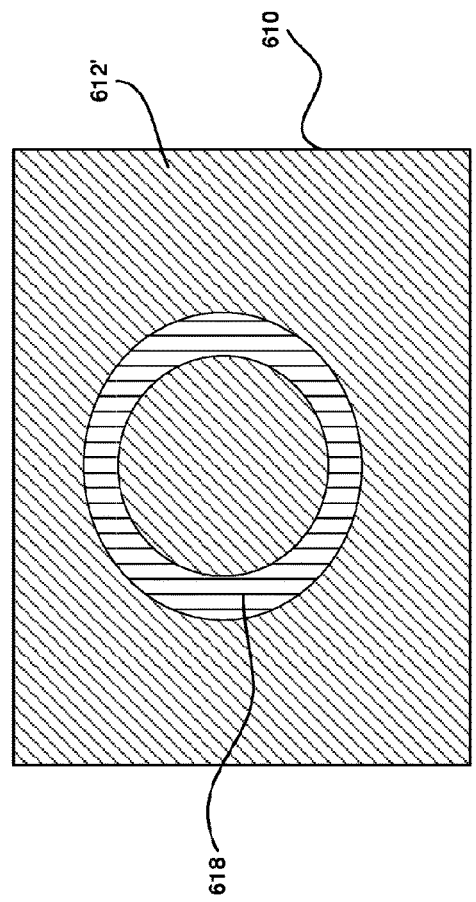
FIG. 25B is a top view of the substrate of FIG. 25A with a second trench adjacent to the first trench.

After the second sacrificial layer 612' is deposited, a second trench 615 is etched through a portion of the sacrificial layer 612' down to the polysilicon material 618 is exposed. As shown in FIG. 25A, the second trench 615 is located and adjacent to the first trench 616. In some embodiments, the second trench 615 may be formed and overlapped the first trench 616. In another embodiment, the second trench 615 may be formed on top of the first trench 616. The second trench 615 formed as an outer ring of the first trench 616 is illustrated in FIG. 25B.

An epitaxial deposition of a second polysilicon material 619 is formed over the second sacrificial layer 612' and the first polysilicon material 618, as illustrated in FIG. 26A. The entire surface of an epi-poly cap 630 comprises of the first polysilicon material 618 is covered by the second polysilicon material 619, as illustrated in FIG. 26B. In some embodiments, only a portion of the epi-poly cap 630 is covered by the second polysilicon material 619.

Figure 27A:
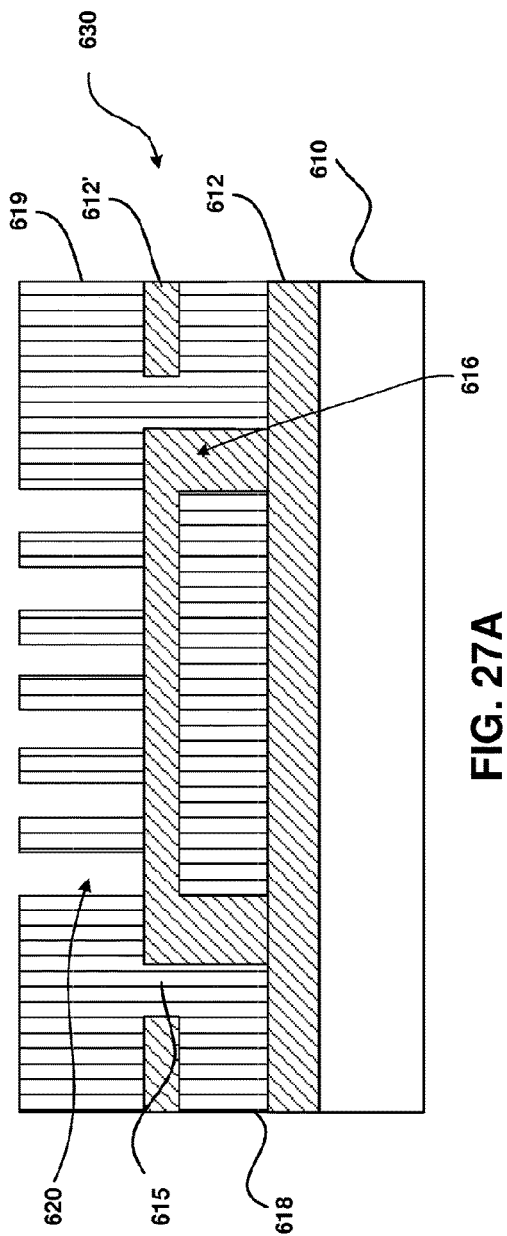
FIG. 27A is a cross sectional view of the substrate of FIGS. 26A and 26B after portions of the epi-poly cap layer and refill material have been etched to form access openings.
Figure 27B:
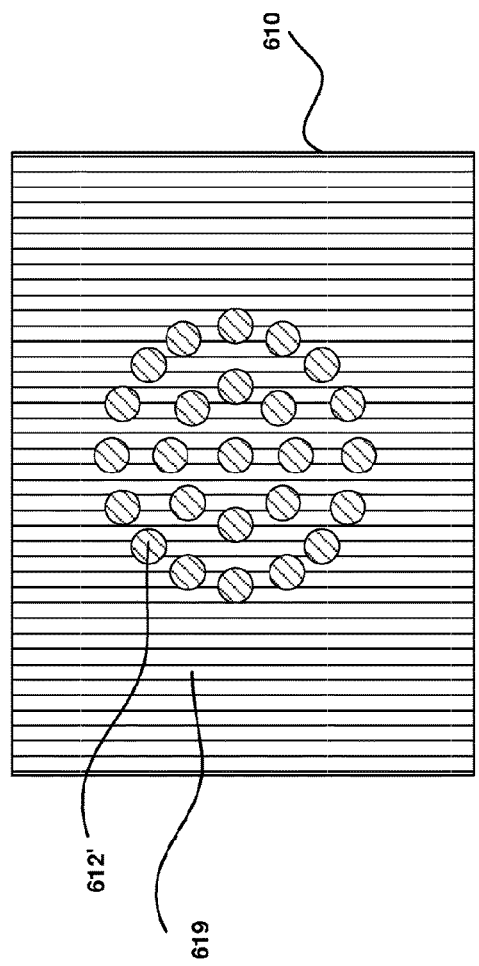
FIG. 27B is a top view of the substrate of FIG. 27A with access openings formed in the epi-poly cap layer and the refill material using a deep reactive ion etching (DRIE) process.

Now referring to FIGS. 27A and 27B, a plurality of access openings 620 are etched through the second polysilicon material 619 until a surface of the second sacrificial layer 612' formed within the first trench 616 is exposed.

Figure 28A:
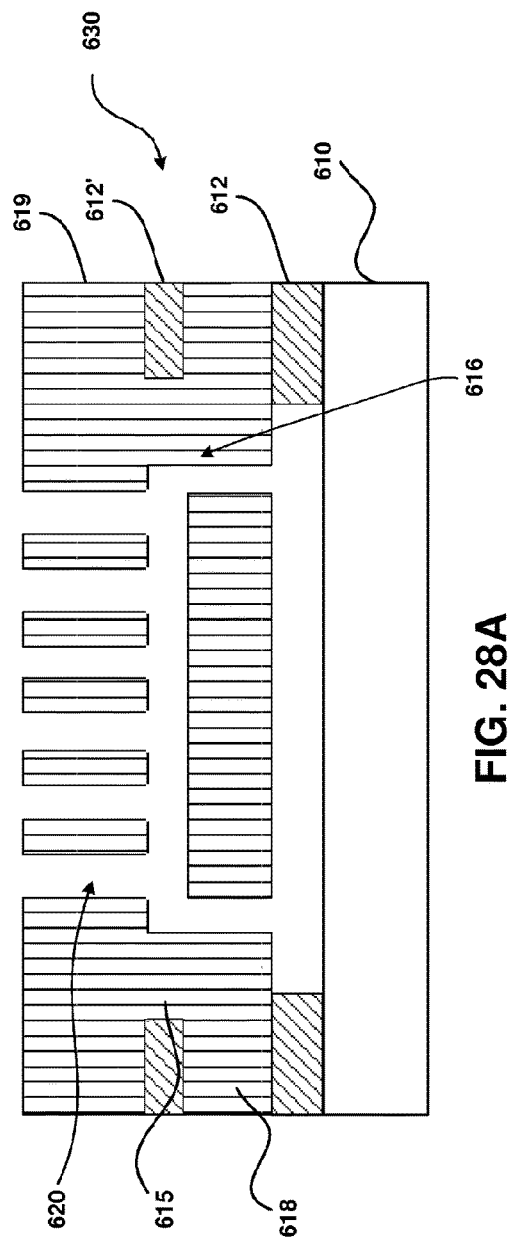
FIG. 28A is a cross sectional view of the substrate of FIGS. 27A and 27B after portions of the first and second sacrificial layers have been etched to form a cavity between the epi-poly cap layer and the substrate and to release a membrane.
Figure 28B:
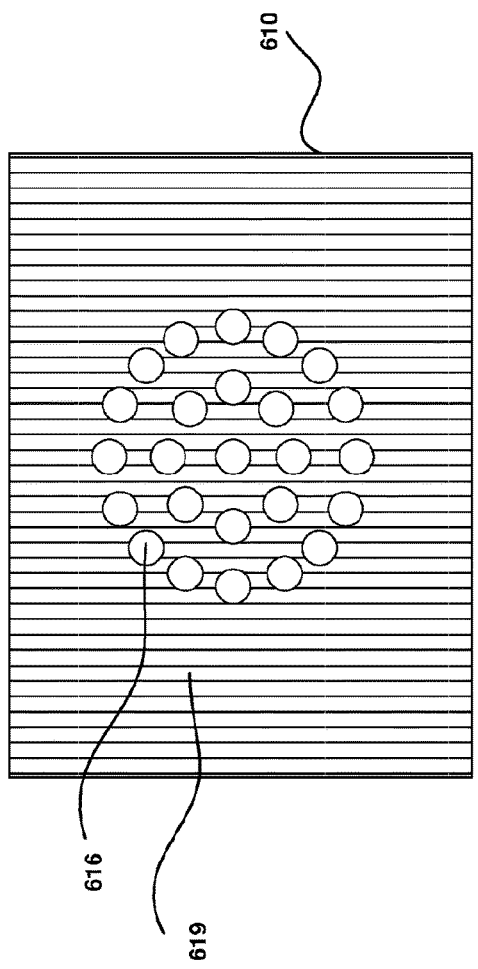
FIG. 28B is a top view of the substrate of FIG. 28A with the cavity formed between the epi-poly cap layer and the substrate and to release a membrane.

The MEMS device 650 undergoes an etching process until the second polysilicon material 619 formed within the trench 616 is removed. The etching process continues until a portion of the first sacrificial layer 612 beneath the trench 616 is also removed, as illustrated in FIGS. 28A and 28B.

Figure 29A:
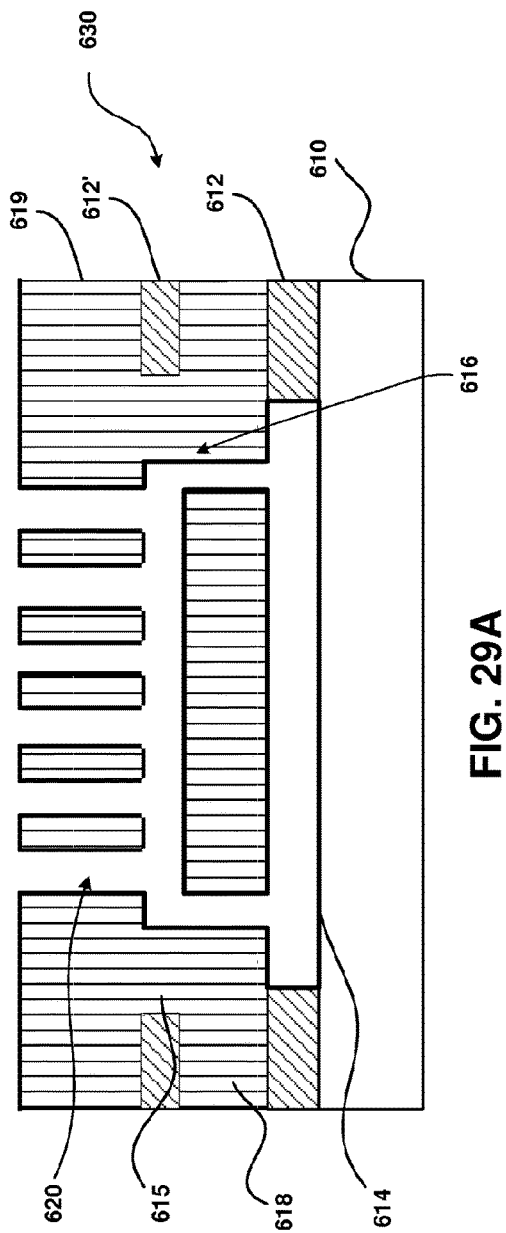
FIG. 29A is a cross sectional view of the substrate of FIGS. 28A and 28B after a deposition of a barrier layer.
Figure 29B:
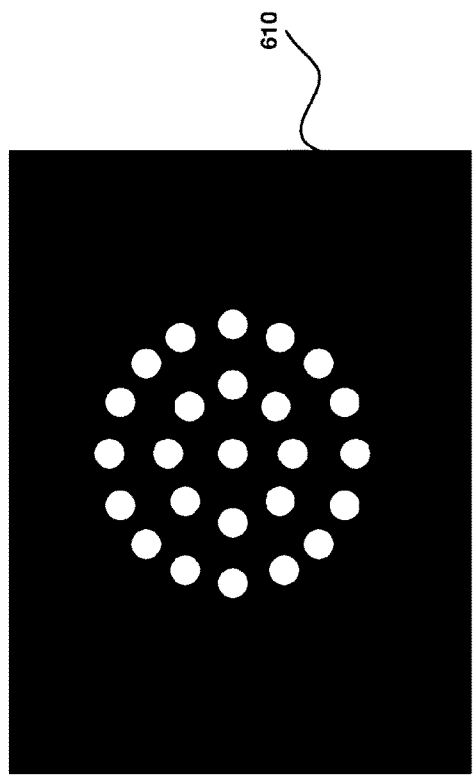
FIG. 29B is a top view of the substrate of FIG. 29A covered with the barrier layer.

A barrier layer 614 is deposited over MEMS device 650 using atomic layer deposition (ALD). The barrier layer 614 may be non-porous Aluminum Oxide ($Al_2O_3$). The thickness of the barrier layer 614 can be precisely controlled via the ALD process. In alternate embodiments, the barrier layer 614 may comprise materials with characteristics that are resistant to vapor hydrofluoric (vHF) acid during the fabrication process at an elevated high temperature. In one embodiment, the temperature may be at least 850° C. The alternate materials that withstand high temperature during epitaxial growth process may also be used as a barrier layer. As illustrated in FIG. 29A, inner walls of the trench 616 formed within the first and second sacrificial layers 612, 612', the epi-poly cap layer 630, and the access openings 620 are covered with the barrier layer 614. Forming the barrier layer 614 on the exposed surfaces preserves scallops. FIG. 29B illustrates a top view of the MEMS device with a plurality of access openings 620 having inner walls covered with the barrier layer 614.

Figure 30A:
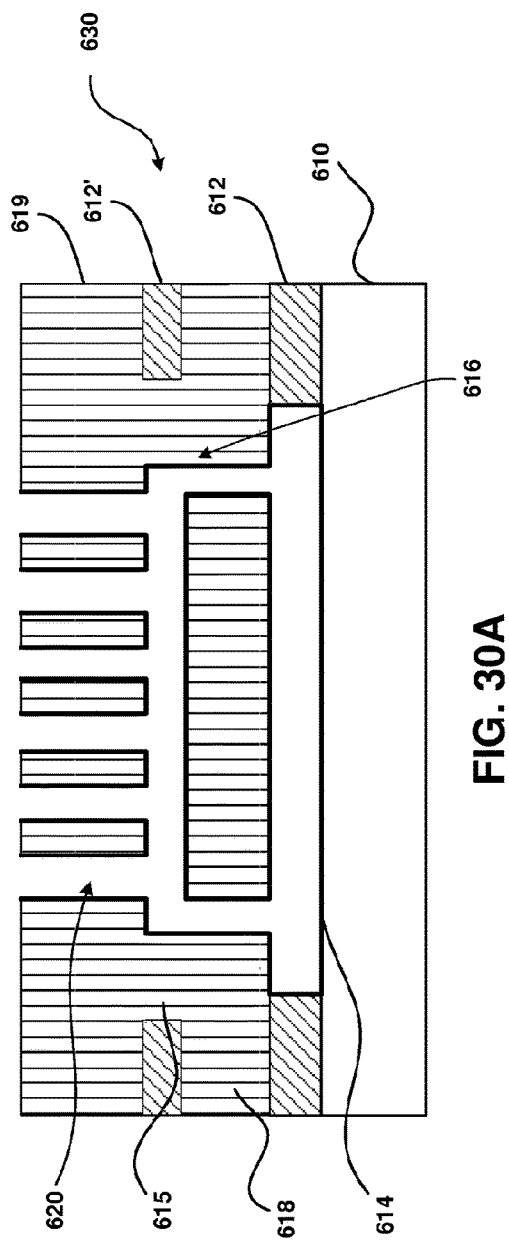
FIG. 30A is a cross sectional view of the substrate of FIGS. 29A and 29B after a portion of the barrier layer has been etched to expose a surface of the epi-poly cap layer.
Figure 30B:
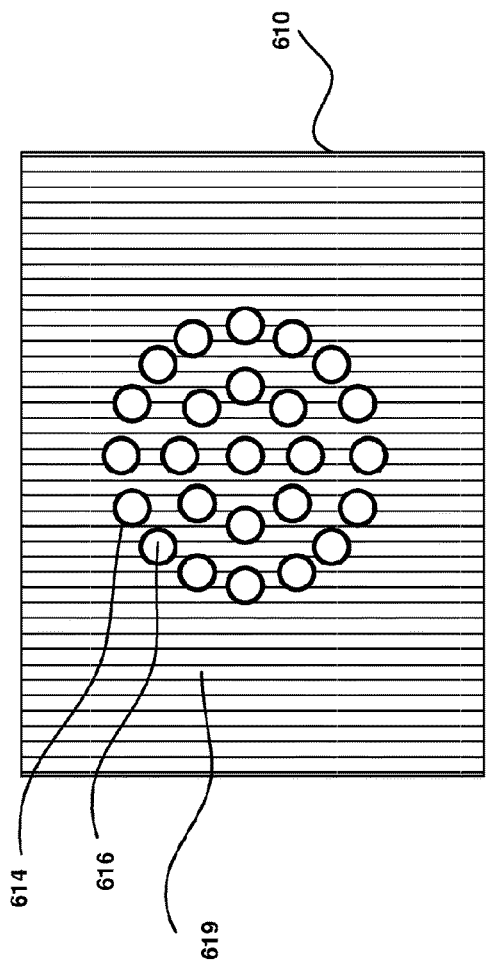
FIG. 30B is a top view of the substrate of FIG. 30A with the surface of the epi-poly cap layer exposed.

As depicted in FIGS. 30A and 30B, a portion of the barrier layer 614 deposited on the second polysilicon material 619 is etched to expose a surface of the second polysilicon material 619.

Figure 31:
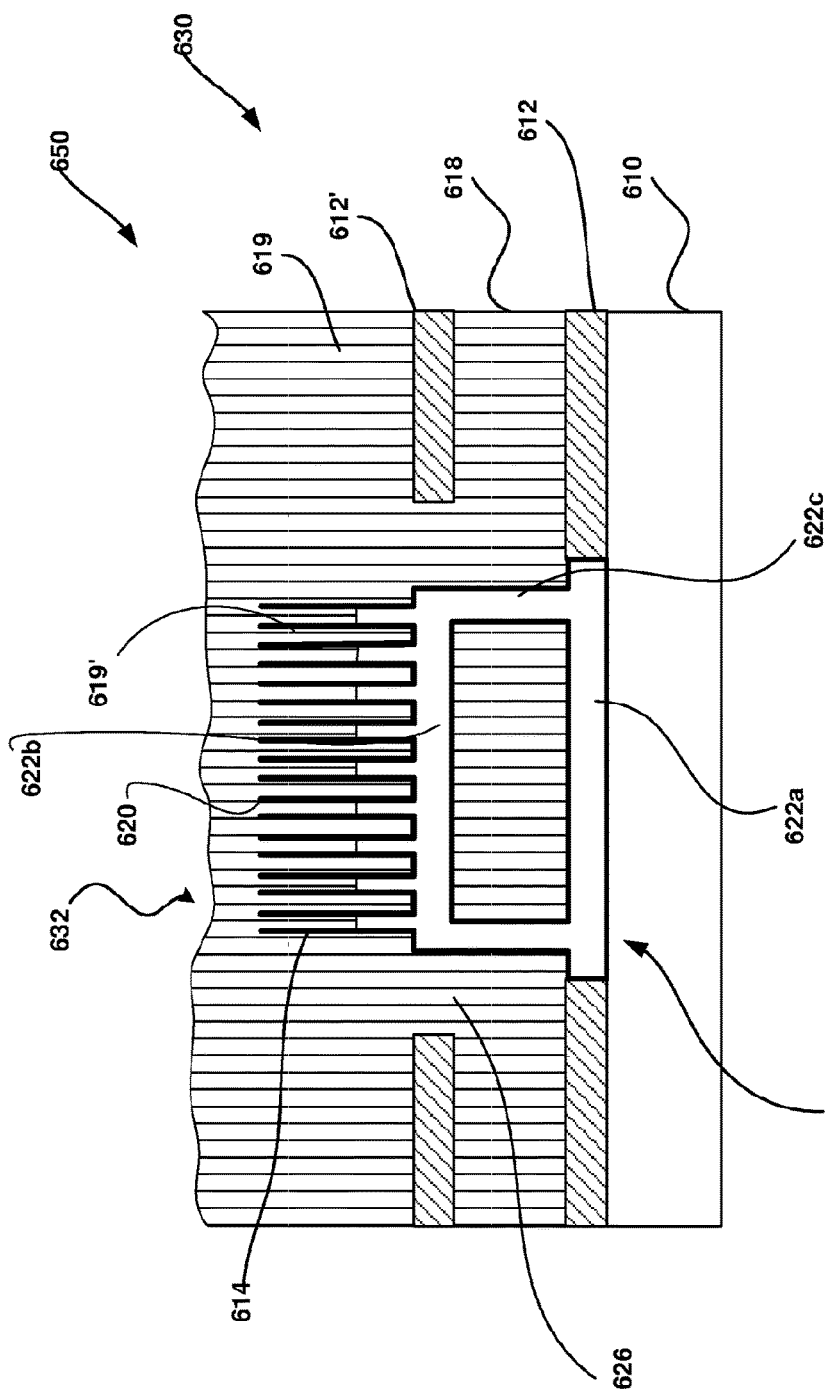
FIG. 31 is a cross sectional view of the substrate of FIGS. 30A and 30B after a deposition of a refill material over the epi-poly cap layer to form the MEMS device.

The substrate 610 is then placed in the epitaxial reactor again for epitaxial growth. During this process, a refill material 619' grows in the access openings 620 as depicted in FIG. 31. In one embodiment, the refill material 619' may be polysilicon layer. In an alternate embodiment, the refill material 619' grown in the access openings 620 may be different from the cap layer material 618 and the second material 619. As shown in FIG. 31, the epi-polysilicon 619' is partially grown in and closes the access openings 620 to seal the trench 622. In some embodiments, the epi-polysilicon 619' is grown from outer ends of the access openings 620 and terminated at inner ends of the access openings near the trench 622 to close the access openings 620 and seal the trench 622. The resulting MEMS device has a reduced surface roughness formed on the epi-poly cap layer 630 and refill epi-polysilicon layers 618, 619, 619', i.e. an epitaxially growth to close the access openings 620 and seal the trench 620. The use of the barrier layer 614 prevents the silicon on the underside of the epi-polysilicon layers 618, 619, 619' from migrating and forming a rough surface on the epi-poly cap layer 630.

As shown in FIG. 31, the trench 616 formed as part of a trench assembly 622 includes a first trench 622a, a second trench 622b, and a third trench 622c. The first and second trench 622a, 622b are formed after portions of the first and second sacrificial layers 612, 612' are etched. The third trench 622c is formed within the first polysilicon material 618 and having a first end fluidly connected to the first trench 622a and a second end fluidly connected to the second trench 622b.

Figure 32:
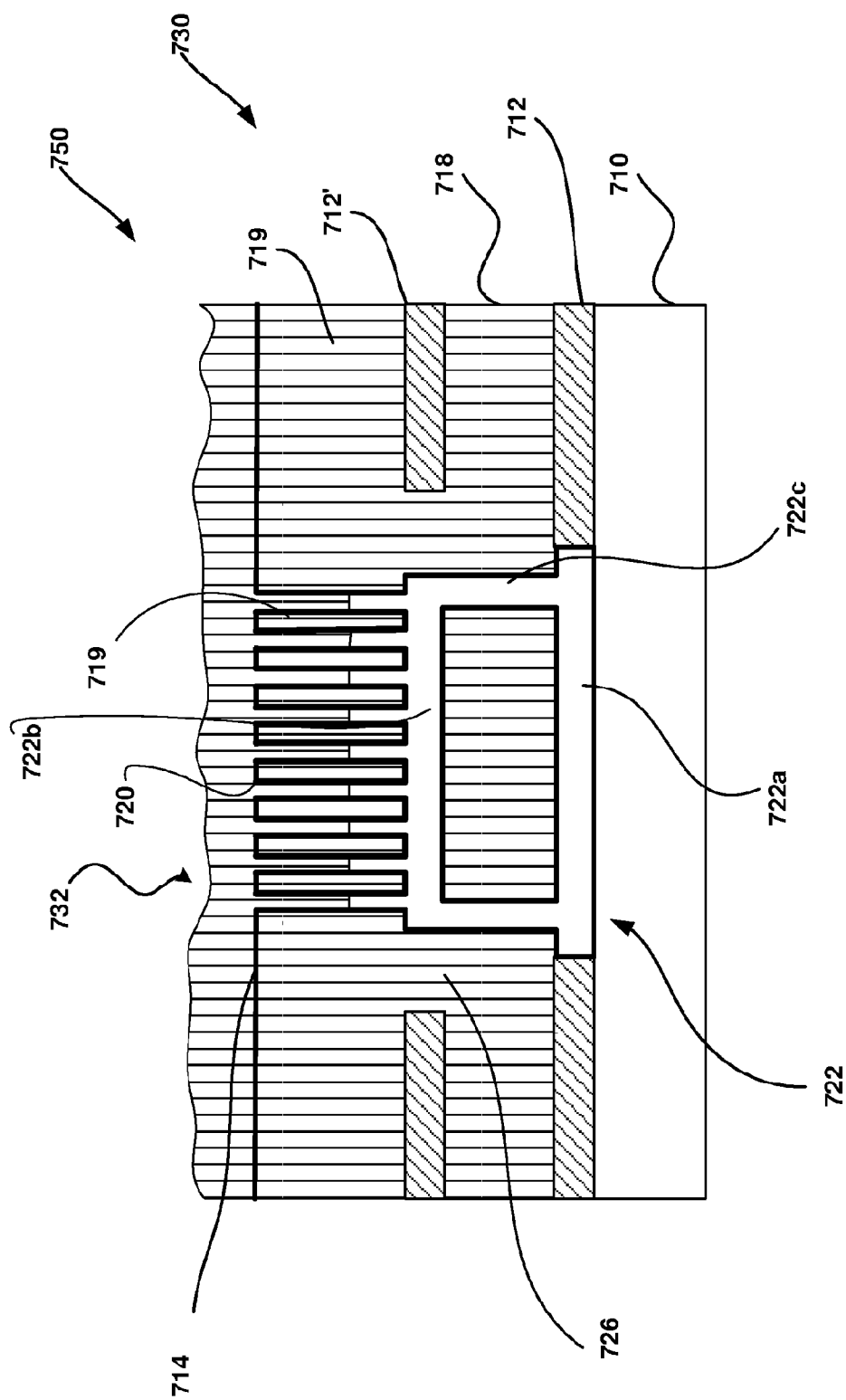
FIG. 32 is a cross sectional view of another described embodiment of a MEMS device with a smoothened and anti-stiction surface in accordance with a disclosure.

FIG. 32 depicts another embodiment of a MEMS device 750 in accordance with the teachings of the disclosure. The MEMS device 750 is similar to the MEMS device 650 as illustrated in FIG. 20, except, a barrier layer 714 is not etched before an epitaxial deposition of a refill material 719 over an epi-poly cap layer 730 and access openings 720.

Methods of employing the above described schemes can be implemented into various integrated circuit devices or MEMS devices. The integrated circuit devices and MEMS devices can include, but are not limited to, microphones, speakers, transducers, inertia sensors such as gyroscopes, accelerometers, motion sensors, optical sensors, imaging sensors, memory chips, and the like.

The devices can then be integrated into various electronic devices such as a mobile phone, computer monitor, a laptop, a tablet, a personal digital assistant (PDA), a hand-held computer, an automotive, a game console, an audio player, a video player, a cable player, a camera, a wearable device, a scanner, a projector, home appliances, and the like.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

What is claimed is:

1. A Microelectromechanical system (MEMS) device comprising:
    a substrate;
    a sacrificial layer on the substrate;
    an etched structure formed in a portion of the sacrificial layer;
    a cap layer epitaxially grown on the sacrificial layer, the cap layer including:
        a first cap layer portion defining at least one access opening extending upwardly from the etched structure; and
        a second cap layer portion defining a lateral wall of the etched structure;
    a barrier layer including:
        a first barrier layer portion deposited on the first cap layer portion of the cap layer;
        a second barrier layer portion deposited on the second cap layer portion of the cap layer; and
    a refill material epitaxially grown on a portion of the first barrier portion and sealing the at least one access opening within the cap layer.

2. The MEMS device of claim 1 wherein the cap layer is a polysilicon layer.

3. The MEMS device of claim 1 wherein the barrier layer is an anti-stiction layer.

4. The MEMS device of claim 1 wherein the etched structure is formed by a vapor hydrofluoric (vHF) acid.

5. The MEMS device of claim 1 wherein the barrier layer is formed from Aluminum Oxide ($Al_2O_3$).

6. The MEMS device of claim 1, further comprising a second sacrificial layer deposited on the cap layer.

7. The MEMS device of claim 6, further comprising a second etched structure formed in a portion of the second sacrificial layer.

8. A method of manufacturing a Microelectromechanical system (MEMS) device, comprising:
    providing a sacrificial layer on a substrate;
    epitaxially growing a cap layer over the sacrificial layer;
    forming at least one access opening through the cap layer;
    forming an etched structure in a portion of the sacrificial layer through the at least one access opening;
    depositing a first barrier layer portion on a first cap portion of the cap layer, the first cap portion defining the at least one access opening;
    depositing a second barrier layer portion on a second cap portion of the cap layer, the second cap portion defining a lateral wall of the etched structure; and
    epitaxially growing a refill material on a portion of the first barrier portion to seal the at least one access opening.

9. The method of claim 8 wherein the cap layer is a polysilicon layer.

10. The method of claim 8 wherein the barrier layer is an anti-stiction layer.

11. The method of claim 8 wherein the etched structure is formed by a vapor hydrofluoric (vHF) acid.

12. The method of claim 8 wherein the barrier layer is formed from Aluminum Oxide ($Al_2O_3$).

13. The method of claim 8, further comprising:
    providing a second sacrificial layer on the cap layer.

14. The method of claim 13, further comprising:
    forming a second etched structure in a portion of the second sacrificial layer.

15. A Microelectromechanical system (MEMS) device, comprising:
- a substrate;
- a first layer on the substrate, the first layer including a lateral wall defining a gap region in the first layer;
- a second layer disposed over the first layer, the second layer including:
  - a support structure disposed on the substrate in a portion of the gap region; and
  - a cap portion supported by the support structure over the gap region so as to define a cavity between the cap portion and the substrate, the cap portion having at least one access opening that extends upwards from the cavity;
- a barrier material coated onto surfaces of the substrate that define the cavity, onto surfaces of the support structure that define the cavity, and onto surfaces of the cap portion that define the at least one access opening; and
- a refill material disposed on a portion of the barrier material coated onto the surfaces of the cap portion so as to seal closed the at least one access opening within the cap portion.

* * * * *